US00RE36371E

United States Patent [19]

Imahashi et al.

[11] E Patent Number: Re. 36,371

[45] Reissued Date of Patent: Nov. 2, 1999

[54] METHOD OF FORMING POLYCRYSTALLINE SILICON FILM IN PROCESS OF MANUFACTURING LCD

[75] Inventors: Issei Imahashi, Yamanashi-ken; Kiichi Hama, Chino; Jiro Hata, Yamanashi-ken, all of Japan

[73] Assignee: Tokyo Electron Limited, Tokyo, Japan

[21] Appl. No.: 08/764,205

[22] Filed: Dec. 13, 1996

Related U.S. Patent Documents

Reissue of:

[64] Patent No.: 5,372,836
Issued: Dec. 13, 1994
Appl. No.: 08/038,621
Filed: Mar. 26, 1993

[30] Foreign Application Priority Data

Mar. 27, 1992 [JP] Japan ..... 4-102012
Jan. 25, 1993 [JP] Japan ..... 5-029975

[51] Int. Cl.[6] ..... B05D 3/06; H01L 21/461; H01L 21/306

[52] U.S. Cl. ..... 427/8; 427/554; 427/555; 438/795; 438/797; 438/799; 438/16

[58] Field of Search ..... 427/554, 555, 427/8; 437/233, 173, 174, 8, 21, 101, 909, 40 TFT, 41 TFT; 148/DIG. 90; 438/795, 797, 799, 14, 16

[56] References Cited

U.S. PATENT DOCUMENTS 4,155,779 5/1979 Auston et al. ..... 437/173
4,292,091 9/1981 Togei ..... 427/555

(List continued on next page.)

FOREIGN PATENT DOCUMENTS 61-78119 4/1986 Japan .
63-54715 3/1988 Japan .
64-25515 1/1989 Japan .
1-51614 2/1989 Japan .
6476715 3/1989 Japan .
1-179315 7/1989 Japan .
1-256114 10/1989 Japan .
3248574 11/1991 Japan .
3-268318 11/1991 Japan .

OTHER PUBLICATIONS

R.A. Laff et al., IEEE Trans. Electron. Dev., 21, 11 (1974) 743, ". . . Isolated Devices on Fused Silica . . . ".

G.L. Hutchins, et al., IBM Tech. Discl. Bulletin, 16, 10 (1974) 3488, "Fabricating Isolated Device . . . Laser Melting".

K. Nakazawa, et al., SID Digest '90 Proceedings, p. 311–4, "LDD TFT Structure for Poly–Si LCD'S".

Leas et al, *IBM Tech Disc. Bulletin*, vol. 23 #9, Feb. 1981 "Method For Laser Annelling of Poly Silicon with Reduced Damage".

Nishimura et al, *Jap. Journal Appl. Phys.*, vol. 21 1982—No Month "Recrystallization of Si Film on Nitride/Oxide Double Insulates Structure by CW Laser Irraditation".

*Primary Examiner*—Marianne Padgett
*Attorney, Agent, or Firm*—Oblon, Spivak, McClelland, Maier & Neustadt, P.C.

[57] ABSTRACT

In a method of forming a polycrystalline silicon film in a process of manufacturing an LCD, a hydrogenated amorphous silicon film is formed on a glass substrate by plasam CVD throughout areas serving as the pixel portion and driver unit of the LCD. A laser beam is radiated on a selected region of the film on the area serving as the driver unit. The energy of the laser beam is set such that hydrogen in the film is discharged without crystallizing the film and damaging the film. The energy of the laser beam is gradually increased to gradually discharge hydrogen from the film. The energy of the laser beam is finally set such that the film is transformed into a polycrystalline silicon film. The amorphous silicon film can be poly-crystallized without damaging the film by the discharge of hydrogen.

21 Claims, 17 Drawing Sheets

U.S. PATENT DOCUMENTS

| | | | |
|---|---|---|---|
| 4,309,225 | 1/1982 | Fan et al. | 427/555 |
| 4,322,253 | 3/1982 | Pankove et al. | 427/555 |
| 4,377,920 | 3/1983 | Shinada et al. | 427/555 |
| 4,406,709 | 9/1983 | Celler et al. | 427/555 |
| 4,439,245 | 3/1984 | Wu | 437/174 |
| 4,466,179 | 8/1984 | Kasten | 427/555 |
| 4,473,433 | 9/1984 | Bosch et al. | 427/555 |
| 4,494,300 | 1/1985 | Schwultke et al. | 427/555 |
| 4,571,348 | 2/1986 | Troxell | 437/174 |
| 4,619,034 | 10/1986 | Janning | 427/555 |
| 4,724,219 | 2/1988 | Ridinger | 427/555 |
| 4,785,962 | 11/1988 | Toshima . | |
| 4,888,302 | 12/1989 | Rumesh | 437/174 |
| 4,965,225 | 10/1990 | Yamagishi et al. | 437/174 |
| 4,985,722 | 1/1991 | Ushijima et al. . | |
| 5,145,808 | 9/1992 | Sameshima et al. | 437/173 |
| 5,147,826 | 9/1992 | Liu et al. | 437/233 |
| 5,186,594 | 2/1993 | Toshima et al. . | |
| 5,186,718 | 2/1993 | Tepman et al. . | |
| 5,219,786 | 6/1993 | Noguchi | 437/174 |
| 5,229,304 | 7/1993 | Chang et al. | 437/174 |
| 5,264,383 | 11/1993 | Young | 437/40 TFT |
| 5,314,831 | 5/1994 | Hirae et al. | 437/8 |
| 5,366,926 | 11/1994 | Mei et al. | 437/173 |
| 5,372,836 | 12/1994 | Imahashi et al. | 437/173 |

ENERGY BAND STRUCTUER OF SILICON

METHOD OF FORMING POLYCRYSTALLINE SILICON FILM IN PROCESS OF MANUFACTURING LCD

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method of forming a polycrystalline silicon (i.e., polysilicon) film in a process of manufacturing an LCD (Liquid Crystal Display).

2. Description of the Related Art

An LCD using a TFT (Thin-Film Transistor) has received a great deal of attention because the LCD provides very excellent picture quality.

An LCD substrate used in the LCD is schematically shown in FIG. 1. A large number of pixel units U each of which is obtained by combining an TFT 102 to a pixel electrode 103 connected to the drain of the TFT 102 are arranged on a glass substrate 104. For example, several hundred thousands square pixel units U whose side has a length of about several hundreds $\mu$m are arranged. A transparent electrode 105 commonly used for the pixel units U is formed to oppose the pixel electrode 103 such that a liquid crystal 106 is formed between the pixel electrodes 103 and the transparent electrode 105, thereby forming a pixel portion 100 as shown in FIG. 2.

A large number of packaged IC chips 107 are arranged on the glass substrate 104 along the peripheral edge of the pixel portion 100. A driver unit 101 is formed by the IC chips 107. These IC chips are independently formed and then adhered to the glass substrate 104. The terminals of each of the IC chips 107 are connected to a source bus and a gate bus connected to each of the pixel units U of the pixel portion 100. For example, the number of gate buses and the number of source buses may reach 400 to 1,920. For this reason, a large number of wiring steps are required to connect the IC chips 107 to the pixel units. This is a factor of increasing the cost of an LCD.

The TFT of each pixel unit does not require its high-speed operation because the TFT causes the pixel of the pixel unit to be displayed as an image. For this reason, an amorphous silicon layer can be used as a semiconductor layer for the TFT. However, each transistor of the driver unit must have an operation speed considerably higher than that of the TFT because a circuit requiring a high-speed switching operation must be mounted on the driver unit. Therefore, a polysilicon film having a field-effect mobility higher than that of an amorphous silicon layer must be used as the semiconductor layer of the driver unit.

The film formation process must be performed at a temperature of about 600° C. or more by, e.g., low-pressure CVD (LPCVD) to obtain a polysilicon layer. However, an inexpensive glass substrate has a thermal strain point of about 600° C. A glass substrate which can withstand a high temperature of about 600° C. is expensive.

Under the above circumstances, a common semiconductor layer which is used for constituting a driver unit, a pixel portion, and a wiring layer cannot be formed on the same glass substrate at the same time. Therefore, a cumbersome and costly operation of adhering IC chips for a driver unit to a glass substrate is inevitable at present.

SUMMARY OF THE INVENTION

It is, therefore, an object of the present invention to simplify the steps in a process of manufacturing an LCD and, more specifically, to form a polysilicon film at least for a driver unit using an amorphous silicon film commonly formed for the driver unit, a pixel portion, and a wiring layer.

According to the present invention, there is provided a method of forming a polycrystalline silicon film in a process of manufacturing an LCD having a pixel portion and a driver unit, comprising:

the step of preparing a glass substrate serving as a substrate of the LCD;

the step of forming a hydrogenated amorphous silicon film on the glass substrate throughout areas serving as the pixel portion and the driver unit;

the hydrogen discharging step of radiating a laser beam having a hydrogen discharging energy on a selected region of the film at least in the area serving as the driver unit, the hydrogen discharging energy being set such that hydrogen in the film is discharged without crystallizing the film and damaging the film; and the crystallizing step of radiating a laser beam having a crystallizing energy on the selected region, the crystallizing energy being set to be higher than the hydrogen discharging energy such that the film is transformed into a polycrystalline silicon film.

More specifically, a hydrogenated amorphous silicon (a-Si:H) film having a large area is formed on a glass substrate by plasma CVD in an atmosphere of, e.g., about 300° C. A laser beam is radiated on the amorphous silicon film of a driver unit and a pixel portion, if desired, to locally heat the amorphous silicon film to a surface temperature of about 1,000° C. to 1,414° C. In this manner, the amorphous silicon film is melted and poly-crystallized to form a polysilicon film for the driver unit.

A heating temperature in the step of forming an amorphous silicon film is lower than that of a polysilicon film. Annealing performed by a laser beam, i.e., laser annealing instantaneously heats the amorphous silicon film to polycrystallize the amorphous silicon film, and the glass substrate is not heated to a high temperature accordingly. Therefore, the glass substrate does not require a high heat resistance, and an inexpensive material can be used as the glass substrate, so that a large-area transparent liquid crystal display can be manufactured.

An a-Si:H film formed by plasma CVD contains a considerably large amount of hydrogen. For this reason, when an energy required for poly-crystallizing the a-Si:H film is given to the a-Si:H film by using a laser beam, hydrogen is discharged from the film at once to degrade the film. Therefore, according to the present invention, the radiation energy of the laser beam is gradually increased to gradually discharge hydrogen [frown] *from* the a-Si:H film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
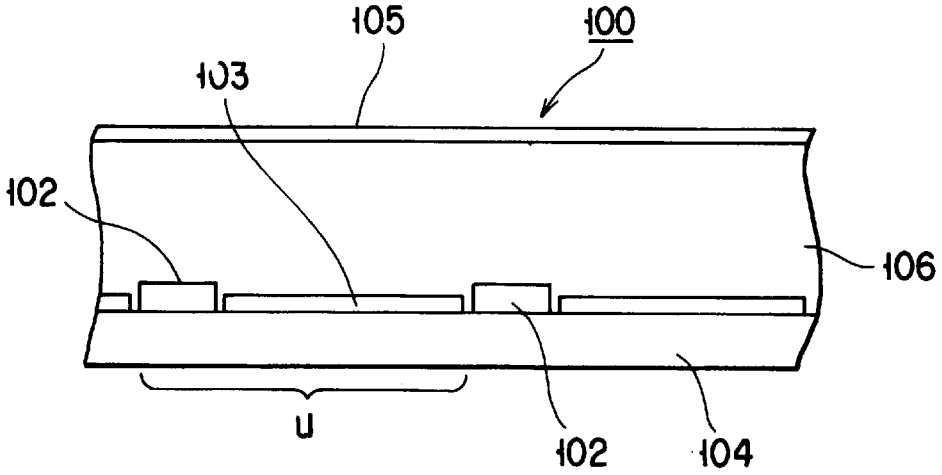
FIG. 1 (PRIOR ART)
FIG. 1 is a view for explaining an LCD substrate.
Figure 2:
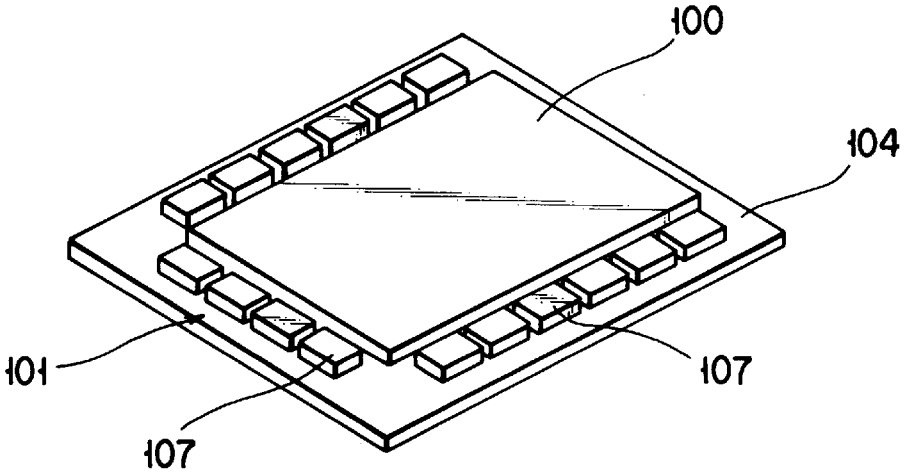
FIG. 2 (PRIOR ART)
FIG. 2 is a perspective view showing the outer appearance of an LCD.
Figure 3:
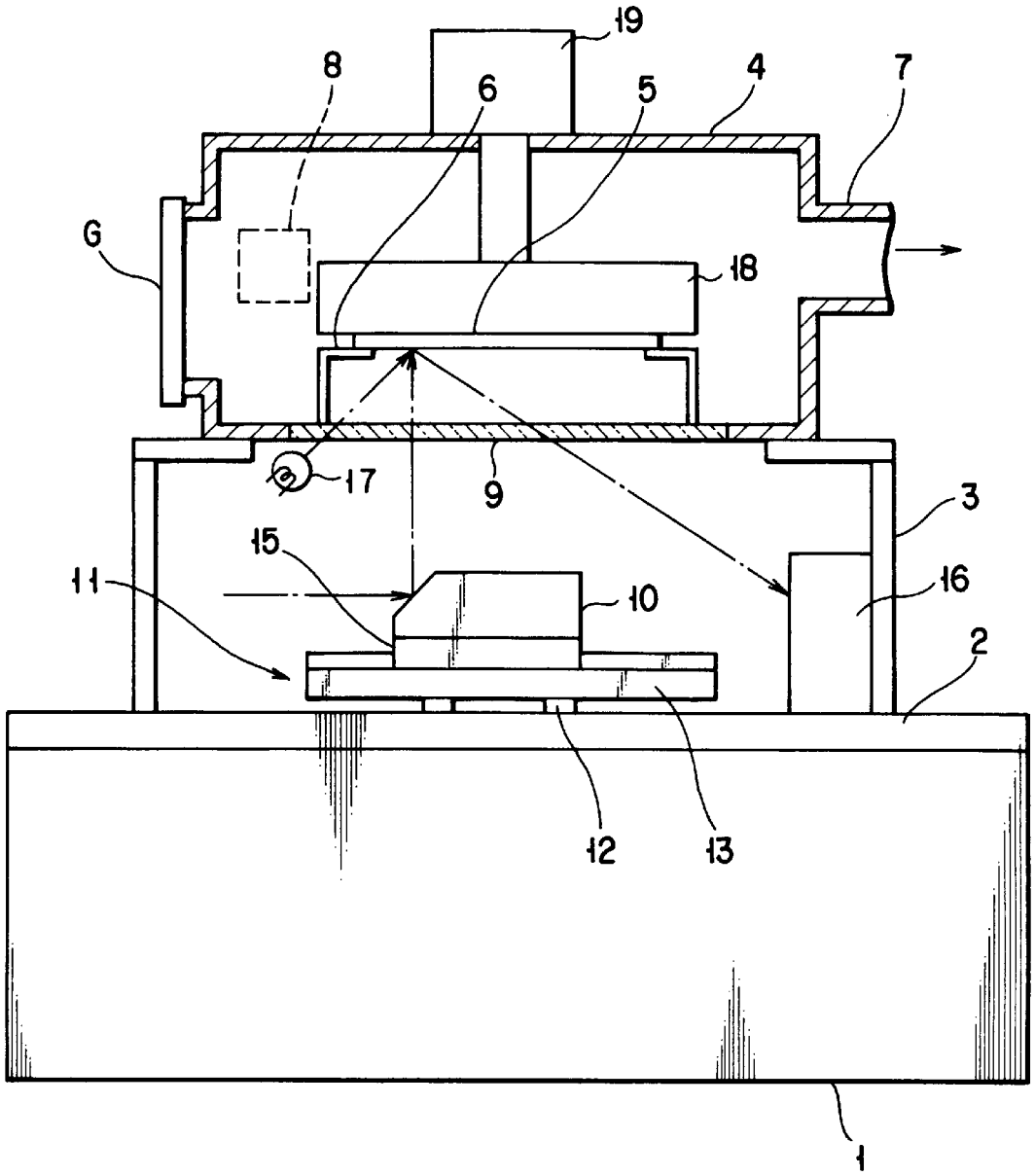
FIG. 3 is a longitudinal sectional side view showing a film forming apparatus according to the present invention.
Figure 4:
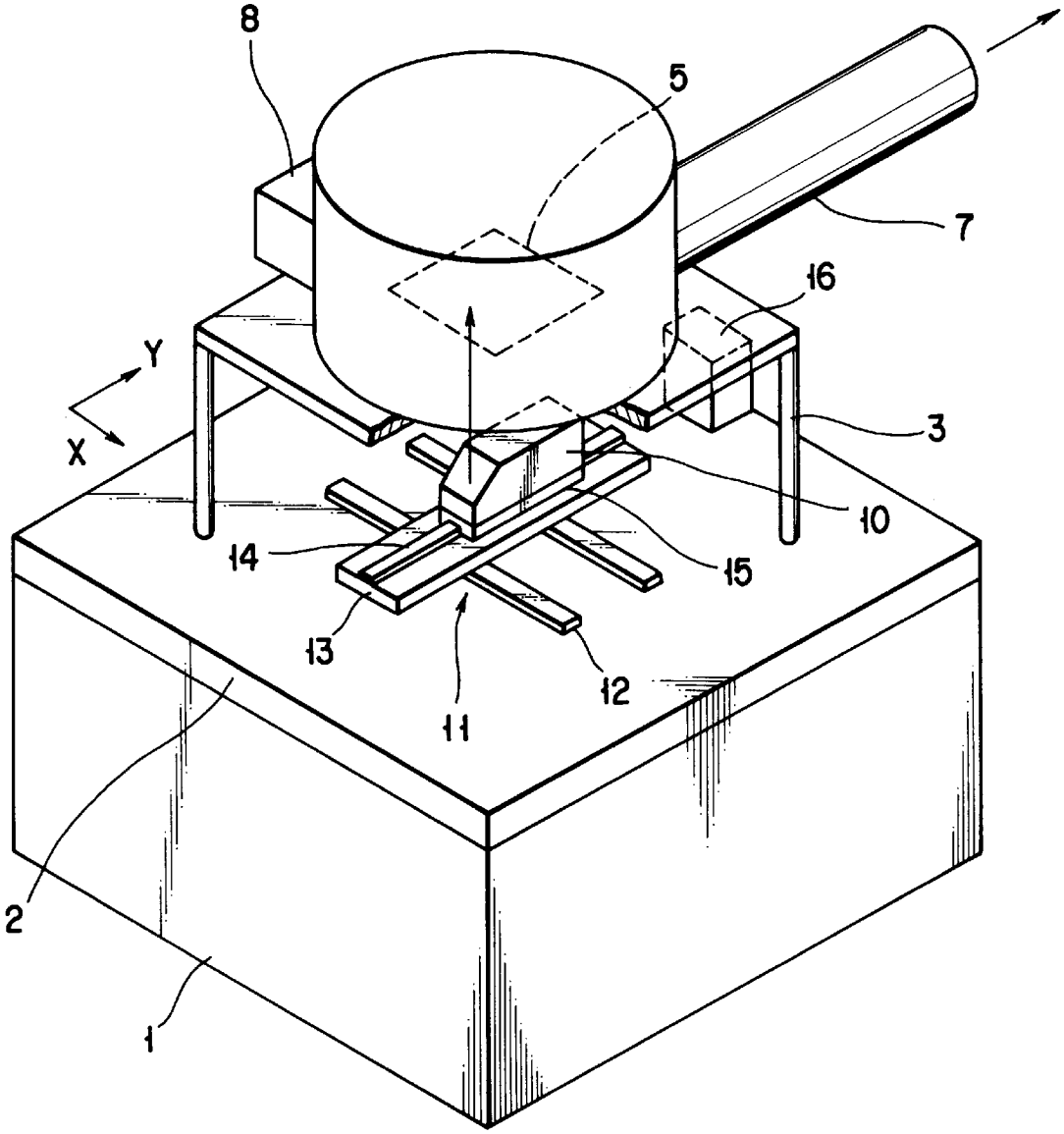
FIG. 4 is a perspective view showing the outer appearance of the apparatus shown in FIG. 3.

FIG. 3 is a longitudinal sectional view showing an apparatus of manufacturing a semiconductor thin film according to an embodiment of the present invention, and FIG. 4 is a partially cutaway perspective view showing the outer appearance of the apparatus. In this embodiment, a pneumatic support mechanism 1 using an air pressure is used as the base of the apparatus. In the pneumatic support mechanism 1, a support plate 2 consisting of a material having rigidity, e.g., a metal is supported by an air suspension to be floated by an air pressure, and the air pressure is controlled such that the support plate 2 is always kept at a horizontal position.

A processing chamber, e.g., a cylindrical vacuum chamber 4 air-tightly covered by an aluminum outer wall is mounted and fixed on the support plate 2 through a support table 3. In the vacuum chamber 4, a placing table 6 for holding an object to be processed, e.g., a glass substrate 5 having a hydrogenated amorphous silicon (a-Si:H) film manufactured by a plasma CVD (PCVD) or an amorphous silicon film manufactured by an LPCVD apparatus, such that the surface to be processed of the glass substrate 5 faces downward.

An exhaust pipe 7 connected to, e.g., a vacuum pump (not shown) communicates with the vacuum chamber 4, and a mass spectrometer 8 for measuring an amount of hydrogen generated by the amorphous silicon film on the substrate 5 is arranged in the vacuum chamber 4. A gate valve G is formed in a part of the side wall of the vacuum chamber 4 such that the glass substrate 5 can be loaded and unloaded between the vacuum chamber 4 and the exterior (outer atmosphere) thereof. A window 9 consisting of, e.g., synthetic quartz glass is formed on the bottom wall of the vacuum chamber 4 to cause a laser beam (to be described later) to pass.

A susceptor 18 is arranged on the placing table 6 to be opposite thereto. The susceptor 18 incorporates a heater. In processing, the susceptor 18 is brought into contact with the minor surface of the substrate 5 to heat the minor surface. The susceptor 18 can be vertically moved by a motor 19 such that the substrate 5 can be easily loaded/unloaded.

A reflecting member 10 and a moving mechanism 11 for moving the reflecting member 10 horizontally, e.g., in an X or Y direction are arranged on the support plate 2. The moving mechanism 11 is constituted by, e.g., an X-direction movable portion 13 and a Y-direction movable portion 15. The X-direction movable portion 13 is moved along a rail 12 arranged on the support plate 2 in the X direction, and the Y-direction movable portion 15 is moved along a rail 14 arranged on the X-direction movable portion 13 in the Y direction. The reflecting member 10 is mounted on the Y-direction movable portion 15. A light source 17, which emits a light having an uniform intensity in a range between 200 nm and 500 nm, is arranged under the window 9 to irradiate the amorphous silicon film formed on the substrate 5 with the light. A reflected light of the light from a selected region of the film is introduced into a spectroscope 16 through a lens focusing optical system (not shown) and is spectroscopically detected by the spectroscope 16.

Figure 5:
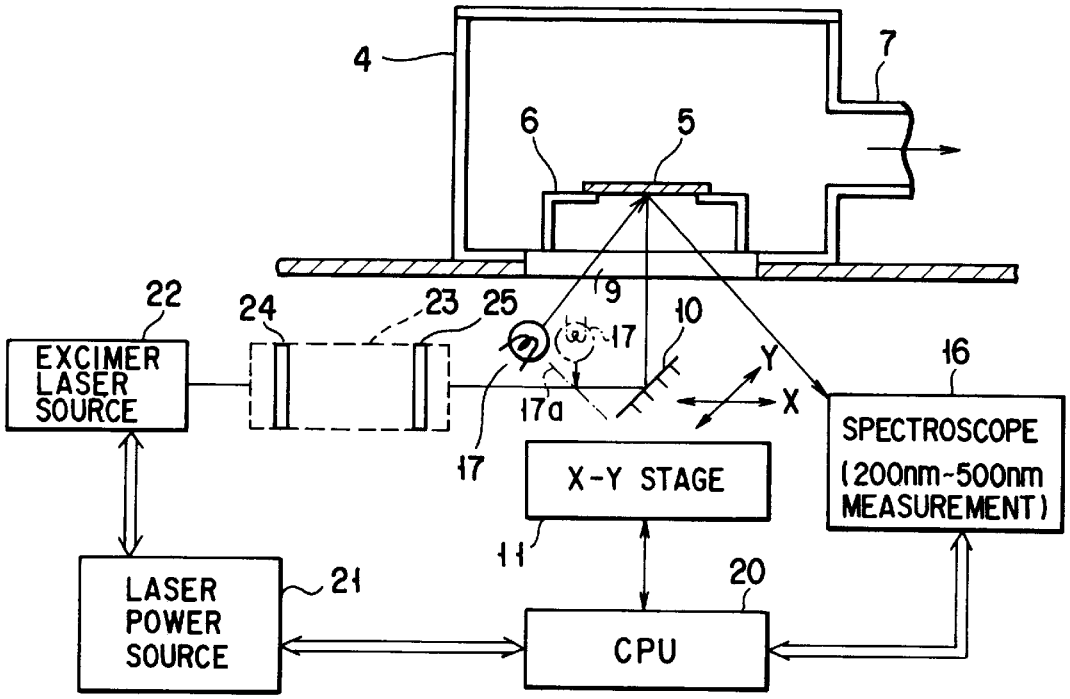
FIG. 5 is a view showing the control system of the apparatus shown in FIG. 3.

A beam splitter 17a may be used as shown in FIG. 5 for radiating the light from the source 17 on the selected region of the film. By virtue of this, the orientation of the light can be controlled simultaneously with a laser beam controlled as described below.

FIG. 5 is a block diagram showing a laser optical system of the apparatus of manufacturing a polysilicon thin film and a feedback control system for a laser beam from the laser optical system. As shown in FIG. 5, when a laser power source 21 is turned on in response to a command from a CPU 20, a laser beam having, e.g., a wavelength of 248 nm is emitted from a laser source 22, e.g., an excimer laser oscillator. The laser beam is transmitted through a homogenizer 23, and the laser beam is radiated in a z-axis direction, i.e., on the bottom surface of the vacuum chamber 4 by the reflecting member 10. The homogenizer 23 comprises an expand lens 24 and a biprism lens 25. The biprism lens 25 divides the laser beam into four parts and inverts them so as to improve the laser beam to have a uniform intensity distribution. The laser beam emitted from the homogenizer 23 is radiated on the substrate 5 as an optical beam having a square section and a uniform intensity distribution. As described above, the reflecting member 10 can be freely moved on the horizontal plane in the X and Y directions by the moving mechanism 11, so that the optical beam from the reflecting member 10 can be radiated to scan a desired region in the surface to be processed of the lower surface of the substrate 5 through the transparent window 9.

A method of transforming a hydrogenated amorphous silicon film (a-Si:H) into a polysilicon film by laser annealing using the above apparatus will be described below. As an object to be processed, a glass substrate having an a-Si:H film formed during the process of manufacturing an LCD is used. A glass substrate is prepared as the substrate for an LCD, and an a-Si:H film commonly used for a pixel portion and a driver unit is formed in a predetermined pattern. The a-Si:H film is formed on the glass substrate by plasma CVD in an atmosphere of about 300° C. At this time, as described above, at least the a-Si:H film of the driver unit must be transformed into a polysilicon film to increase the field-effect mobility.

The gate valve G is opened, and the substrate 5 is placed on the placing table 6 in the vacuum chamber 4 by a convey mechanism (not shown) such that the surface to be processed of the substrate faces downward. The gate value G is closed, and the vacuum chamber 4 is evacuated by a vacuum pump (not shown) through the exhaust pipe 7 to be set in a vacuum atmosphere of, e.g., a pressure of $2.5\times10^{-7}$ Torr. The susceptor 18 is moved downward to be brought into contact with the minor surface of the substrate 5. The temperature of the susceptor 18 is set such that the temperature of the substrate 5 in laser annealing is set at, e.g., 300° C. The substrate 5 is heated to prolong crystallization of the silicon film after the film is melted, and grow crystalline grains bigger. In consideration of the heat resistance of the glass substrate 5 and the crystallization of the silicon film, the temperature of the substrate 5 is preferably set to be about 300° C. A laser beam transmitted from the excimer laser beam oscillator is radiated on the a-Si:H film in the region of the driver unit on the substrate 5 through the reflecting member 10 to scan the region while the moving mechanism 11 is driven.

In this case, an excimer laser beam is oscillated like a pulse, and the laser beam has a period of 10 Hz. The laser beam scans the a-Si:H film to be shifted by an interval of 1.25 mm every pulse. For this reason, when a laser beam having a beam size of 0.9 cm×0.9 cm is used, the a-Si:H film is irradiated with the laser beam corresponding to about 7.2 pulses per scanning operation. When a laser beam having a beam size of 0.65 cm×0.65 cm is used, the a-Si:H film is irradiated with the laser beam corresponding to about 5.2 pulses per scanning operation.

[when] *When* the laser beam is radiated on the a-Si:H film, at the beginning, the output energy of the laser beam is set to be a lower energy than an energy required for polycrystallizing the a-Si:H film. The laser beam having the constant low energy, e.g., 160 mJ (a beam size is 0.9 cm×0.9 cm, and the transmittance of all the optical systems is 70%, thereby setting the energy density of the film surface to be 138 mJ/cm$^2$) scans the a-Si:H film a plurality of times.

An amount of hydrogen is monitored by the mass spectrometer. After the amount of hydrogen is almost equal to the amount of the hydrogen in the immediately preceding scanning operation, the output energy is slightly increased to, e.g., 200 mJ (energy density: 173 mJ/cm$^2$. The laser beam having the energy is radiated on the film several times to scan the film, and similarly, an amount of hydrogen is monitored. In addition, the energy is further increased to, e.g., 240 mJ (energy density: 207 mJ/cm$^2$), and the same process as described above is performed. In this manner, the energy is gradually increased, and the above process is repeated, thereby gradually discharging hydrogen from the a-Si:H film. A laser beam having an energy enough to poly-crystallize the a-Si:H film is radiated on the a-Si:H film, and the a-Si:H film is transformed into a polysilicon film. In this case, an aperture for the laser beam may be regulated without changing the output energy of the laser beam to change the irradiation energy (energy per unit area of a surface to be processed) of the laser beam.

Figure 6:
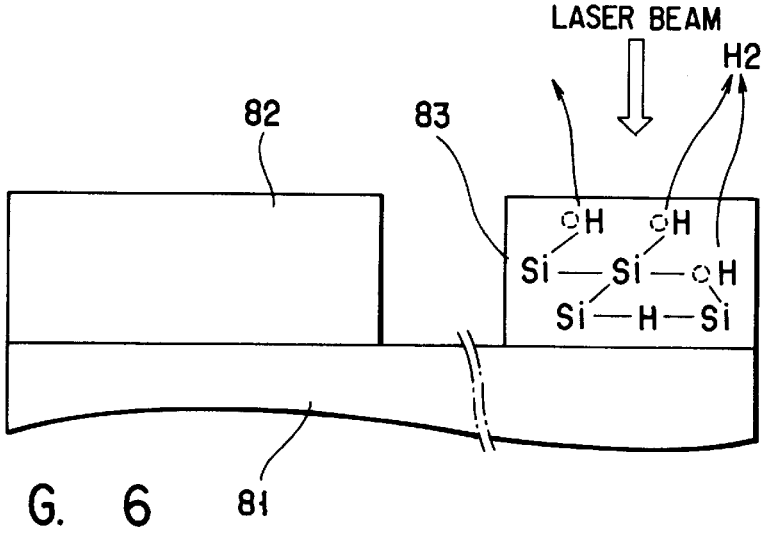
FIG. 6 is a view for explaining laser annealing.

FIG. 6 is a schematic view showing the state of the above laser annealing. In FIG. 6, reference symbol 81 denotes a glass substrate; 82, an a-Si:H film for forming TFTs of a pixel portion; and 83, an a-Si:H film for forming a driver unit.

According to the above method, when a laser beam having a low energy is radiated on the a-Si:H film, an amount of hydrogen proportional to the energy is discharged. When a laser beam having the same energy is radiated on the a-Si:H film several times to scan the a-Si:H film, an amount of hydrogen proportional to the energy is gradually decreased in accordance with the number of times of scanning, and almost all hydrogen is discharged. The energy of the laser beam is slightly higher than the previous irradiation energy, and the same process as described above is performed. At this time, an amount of hydrogen proportional to the high energy is gradually generated in accordance with the number of times of scanning irradiation. In this manner, when the irradiation energy of the laser beam is increased, hydrogen in the a-Si:H film is sequentially discharged in accordance with a change in energy.

Hydrogen in the a-Si:H film is discharged stepwise, and irradiation is shifted to irradiation having a high energy while an amount of hydrogen is monitored, thereby substantially preventing the film from being damaged. Almost all hydrogen which the a-Si:H film contains is discharged, and the hydrogen content of the a-Si:H film is small when a high energy is applied to the a-Si:H film to poly-crystallize the a-Si:H film. For this reason, even when the remaining hydrogen is discharged at once, the film is not damaged. In contrast to this, when a laser beam having an energy enough to poly-crystallize the a-Si:H film is radiated on the a-Si:H film from the beginning, hydrogen contained in the a-Si:H film is discharged at once to be exploded. For this reason, the abrupt hydrogen jet damages the film.

An amount of hydrogen smaller than a predetermined amount is generated even when the irradiation energy of the laser beam is increased. In this state, the step of radiating the laser beam having an energy required for poly-crystallizing the a-Si:H film is performed for the first time.

A method of setting the output energy of the laser beam and the number of times of scanning irradiation may be set on the basis of the result obtained as follows. For example, irradiation having various patterns is performed to each of various types of objects to be processed in advance, and an amount of discharged hydrogen is detected by the mass spectrograph 8. In other words, when the values of an energy of the laser beam for discharging hydrogen for the first time, an intermediate energy of the laser beam for discharging hydrogen, and an energy of the laser beam for crystallizing the film are set in advance by performing experiments such as experiments (will be described later) to a sample having a condition similar to that of an actual object to be processed, the present invention can be performed without monitoring an amount of discharged hydrogen. Note that a measuring means other than a mass spectrograph may be used to detect an amount of hydrogen gas.

The polysilicon film is formed as described above, and the pressure in the vacuum chamber 4 is returned to an atmospheric pressure. The gate valve G is opened, and the substrate 5 is unloaded from the vacuum chamber 4 by a convey mechanism (not shown). A film formation process is performed to the substrate in a semiconductor processing station including a film form processing station or a lithographic station. In this film formation process, masks having different predetermined patterns are independently used in a pixel portion area and a driver unit area of an LCD substrate on the same substrate, and TFTs each constituting a part of a pixel unit and switching elements of the driver unit are simultaneously formed. At the same time, in this process, an electrode wiring layer for connecting the pixel portion to the driver unit is formed.

In the apparatus shown in FIG. 3, the reflecting member 10 is arranged outside the vacuum chamber 4 below the vacuum chamber 4, and the surface to be processed of the substrate faces downward such that a laser beam is radiated upward on the surface. For this reason, the moving mechanism may be fixed on the support plate 2 without being suspended, and the moving mechanism can be stably moved, so that the accuracy of the movement path of the reflecting member 10 can be kept high.

The support plate 2 can be horizontally maintained under the pneumatic control, and the vacuum chamber 4 is supported on the support plate 2. For this reason, both the movement path and the LCD substrate 5 can be horizontally maintained at high accuracy. Therefore, scanning irradiation of a laser beam can be performed at high accuracy. As the support plate 2, any support plate having a structure which does not transmit external vibrations even when the support plate is not horizontally controlled by an air pressure or the like may be used.

In laser annealing to an a-Si:H film, various irradiation modes of the laser beam were used, and experiments of detecting an amount of hydrogen discharged from the a-Si:H film and of observing the state of the a-Si:H film were performed. A sample obtained by formed an a-Si:H film having a thickness of 1,000 Å on a glass substrate by plasma CVD was prepared. This sample was placed in the vacuum chamber 4 of the apparatus shown in FIG. 3. The pressure in the vacuum chamber 4 was set to be $2.5\times10^{-7}$ Torr. The temperature of the susceptor 18 was set such that the temperature of the sample was set at 300° C. The distance between the sample and the biprism lens 25 was set to be 340 mm when a laser beam had a beam size of 0.9 cm×0.9 cm, and the distance was set to be 230 mm when the laser beam had a beam size of 0.65 cm×0.65 cm.

As described above, an excimer laser beam was oscillated like a pulse, and the period of the beam was 10 Hz. Scanning was performed such that the laser beam was shifted by an interval of 1.25 mm every pulse. Therefore, when the laser beam having a beam size of 0.9 cm×0.9 cm was used, the a-Si:H film was irradiated with the laser beam corresponding to about 7.2 pulses per scanning operation. When a laser beam having a beam size of 0.65 cm×0.65 cm was used, the a-Si:H film was irradiated with the laser beam corresponding to about 5.2 pulses per scanning operation. In addition, the transmittance of the entire optical system through which the laser beam passes was 70%.

[Experiment 1]

Figure 7:
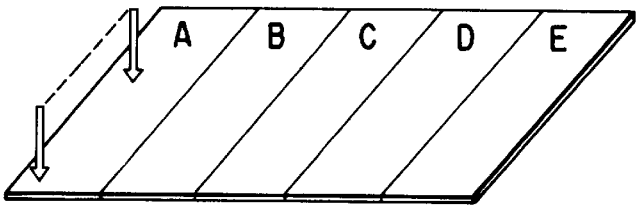
FIG. 7 is a perspective view showing a scanned/irradiated region of an a-Si:H film.
Figure 8:
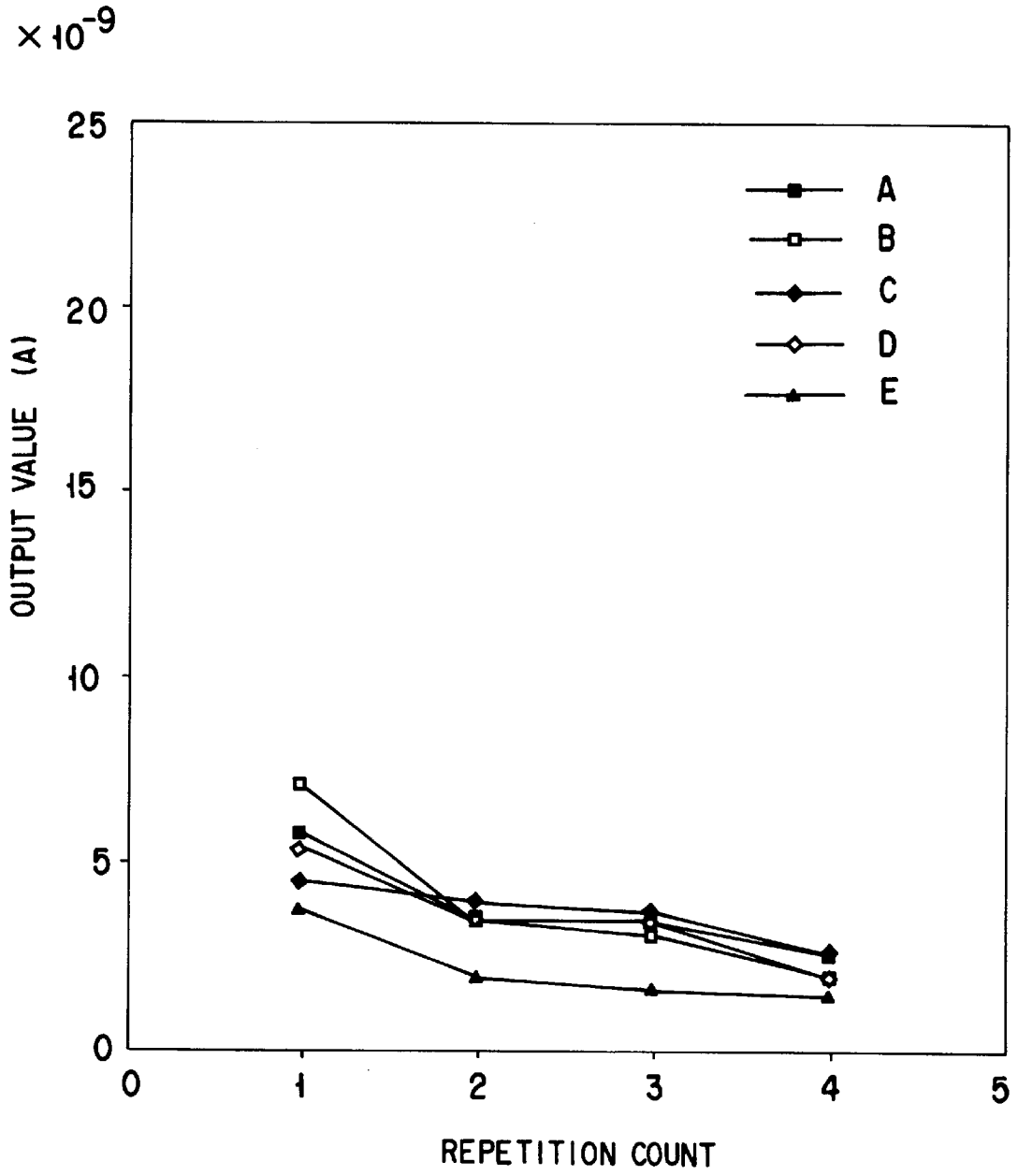
FIG. 8 is a graph showing a relationship between an irradiation mode of a laser beam and an amount of discharged hydrogen.

As shown in FIG. 7, the a-Si:H film was divided into five areas A to E. A laser beam having a beam size of 0.9 cm×0.9 cm and an output energy of 120 mJ was repeatedly radiated on all the areas predetermined times. At this time, the energy density of the laser beam per pulse on the film surface was about 104 mJ/cm$^2$. A relationship between an output energy, a repetition count, and an amount of discharged hydrogen is shown in FIG. 8. In FIG. 8, output values corresponding to amounts of discharged hydrogen ($H_2$) in the mass spectrometer are plotted along the ordinate. Each of the areas was divided into three regions of each area, and the same processing as described above was performed to the three regions, and an average of output values obtained by performing the processing three times was calculated. Assuming that a process of performing scanning irradiation from one end of each area to the other end is called one scanning operation, the repetition count means the number of times of scanning in the same area. In this experiment, any damage was not detected in the a-Si:H film. It was understood that a variation in output value of the areas was caused by experimental errors.

[Experiment 2]

Figure 9:
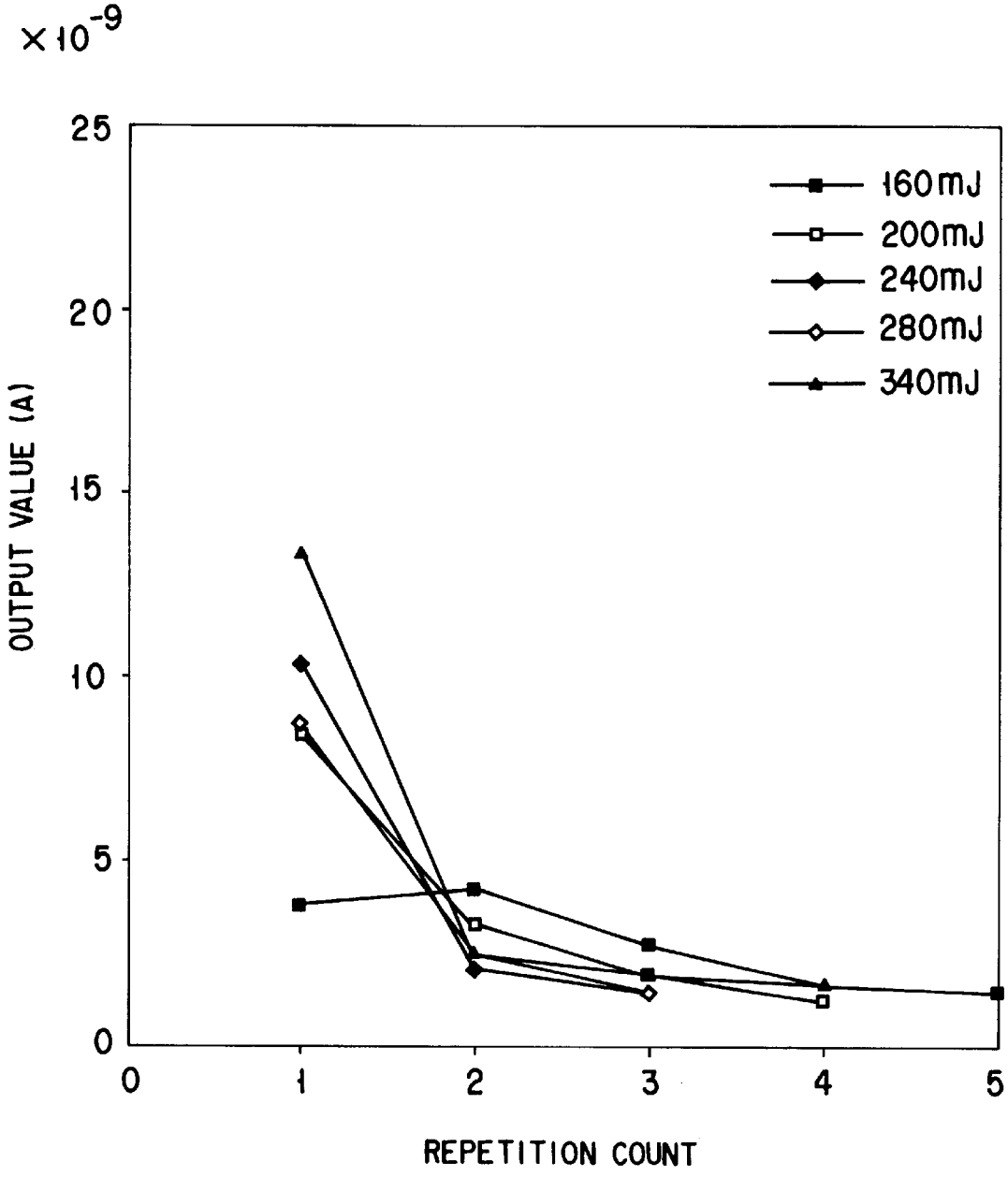
FIG. 9 is a graph showing a relationship between another irradiation mode of a laser beam and an amount of discharged hydrogen.

After Experiment 1, a laser beam having a beam size Of 0.9 cm×0.9 cm was repeatedly radiated on the areas A to E with output energies of 160 mJ, 200 mJ, 240 mJ, 280 mJ, and 340 mJ predetermined times, respectively. At this time, energy densities of the laser beam per pulse on the film surface were about 138 mJ/cm$^2$, 173 mJ/cm$^2$, 207 mJ/cm$^2$, 242 mJ/cm$^2$, and 294 mJ/cm$^2$, respectively. Relationships between the output energies, repetition counts, and amounts of discharged hydrogen are shown in FIG. 9. In this experiment, any damage was not detected in the a-Si:H film.

[Experiment 3]

Figure 10:
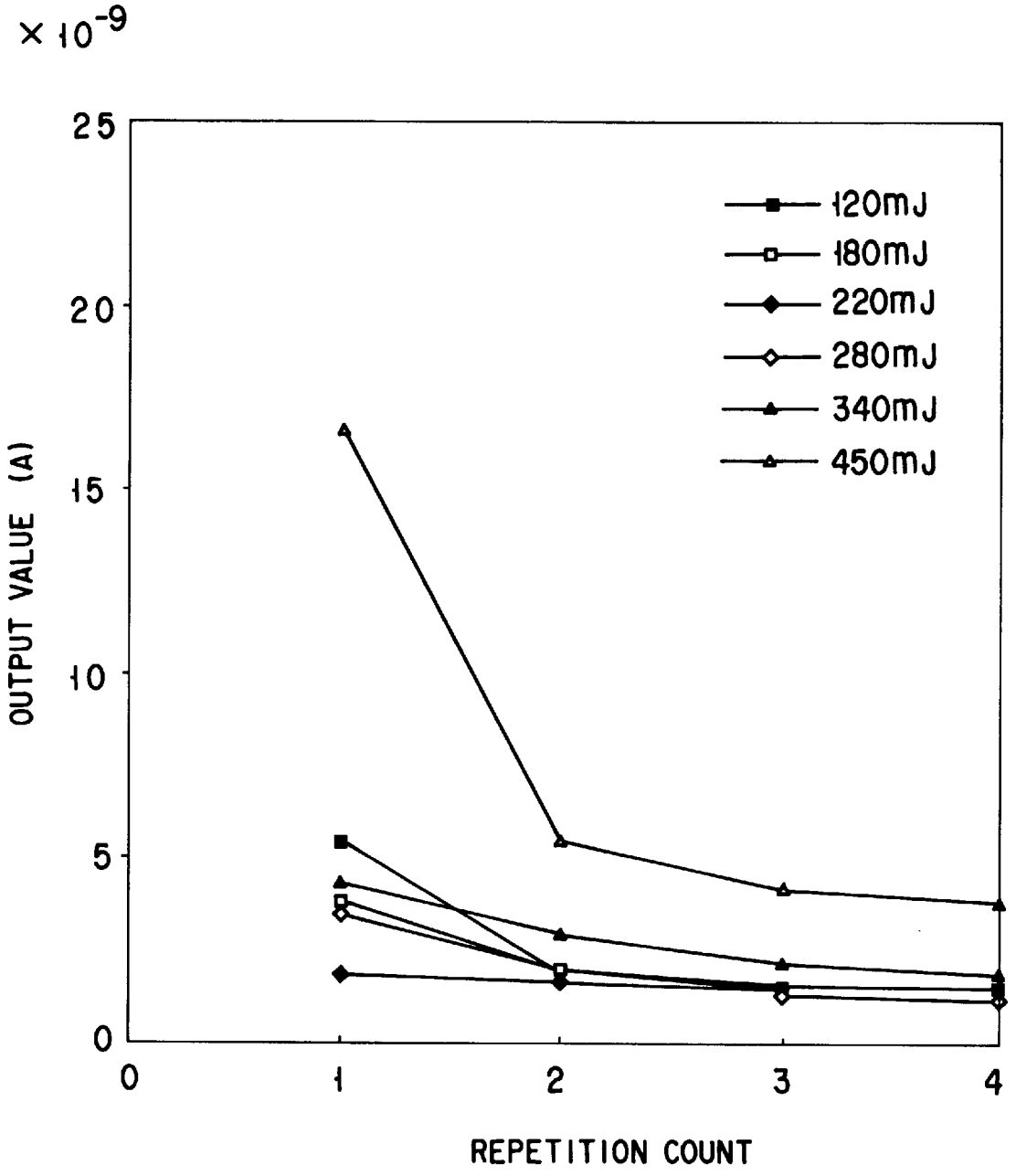
FIG. 10 is a graph showing a relationship between still another irradiation mode of a laser beam and an amount of discharged hydrogen.

A laser beam having a beam size of 0.9 cm×0.9 cm was repeatedly radiated on all the areas with an output energy being increased in an order of 120 mJ, 160 mJ, 220 mJ, 280 mJ, 340 mJ, and 450 mJ four times without distinguishing the areas from each other. At this time, energy densities per pulse of the laser beam having the output energies on the film surface were about 104 mJ/cm$^2$, 138 mJ/cm$^2$, 190 mJ/cm$^2$, 242 mJ/cm$^2$, 294 mJ/cm$^2$, and 389 mJ/cm$^2$, respectively. The result is shown in FIG. 10. In this experiment, any damage was not detected in the a-Si:H film.

[Experiment 4]

Figure 11:
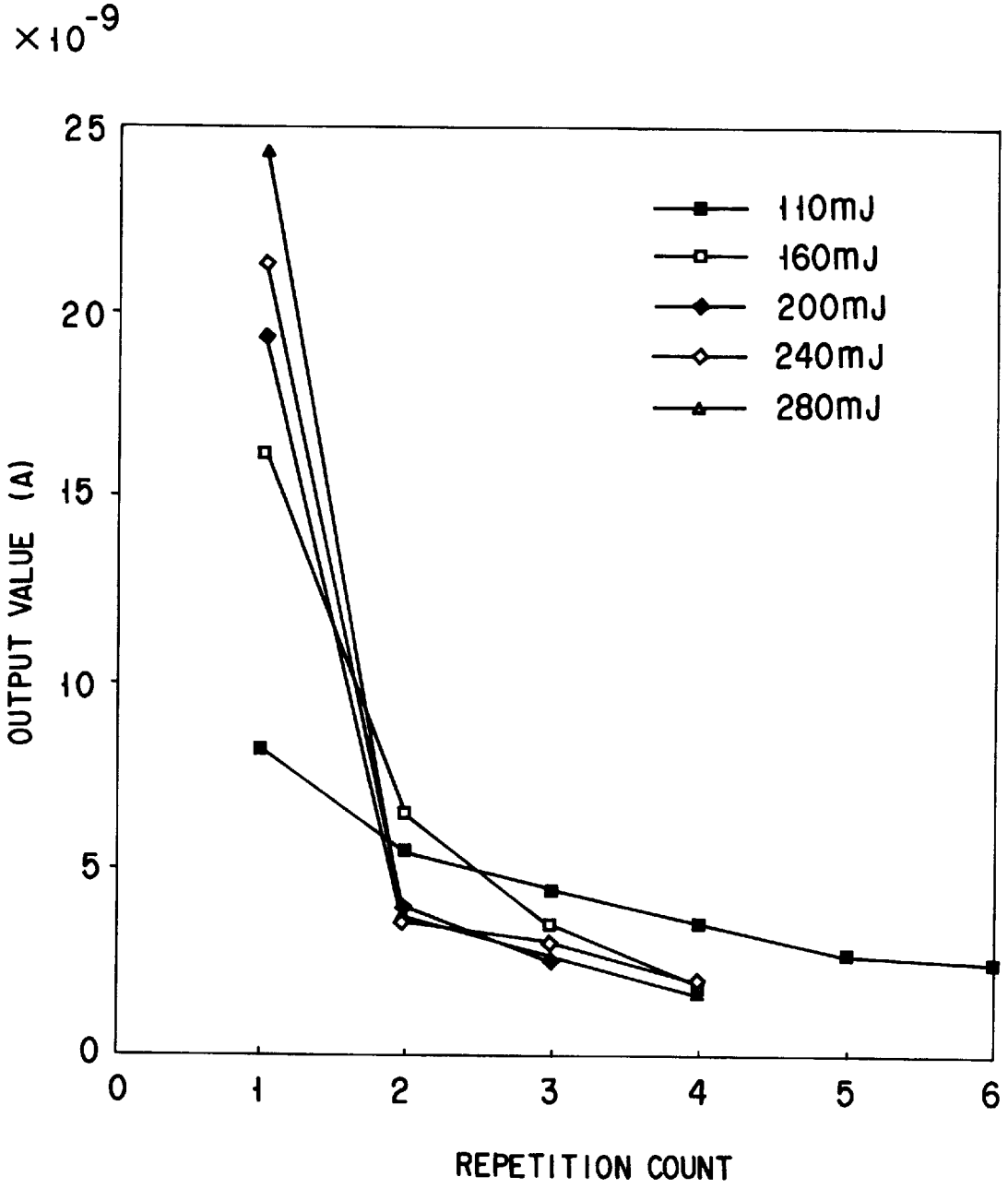
FIG. 11 is a graph showing a relationship between still another irradiation mode of a laser beam and an amount of discharged hydrogen.

A laser beam having a beam size of 0.9 cm×0.9 cm was repeatedly radiated on the areas A to E with outputs energies of 110 mJ, 160 mJ, 200 mJ, 240 mJ, and 280 mJ predetermined times, respectively. At this time, energy densities of the laser beam per one pulse on the film surface were about 95 mJ/cm$^2$, 138 mJ/cm$^2$, 173 mJ/cm$^2$, 207 mJ/cm$^2$, and 242 mJ/cm$^2$, respectively. The result is shown in FIG. 11. In this experiment, damage to the film was detected in an area on which the laser beam having an output energy of 200 mJ (energy density: 173 mJ/cm$^2$) or more was radiated.

[Experiment 5]

Figure 12:
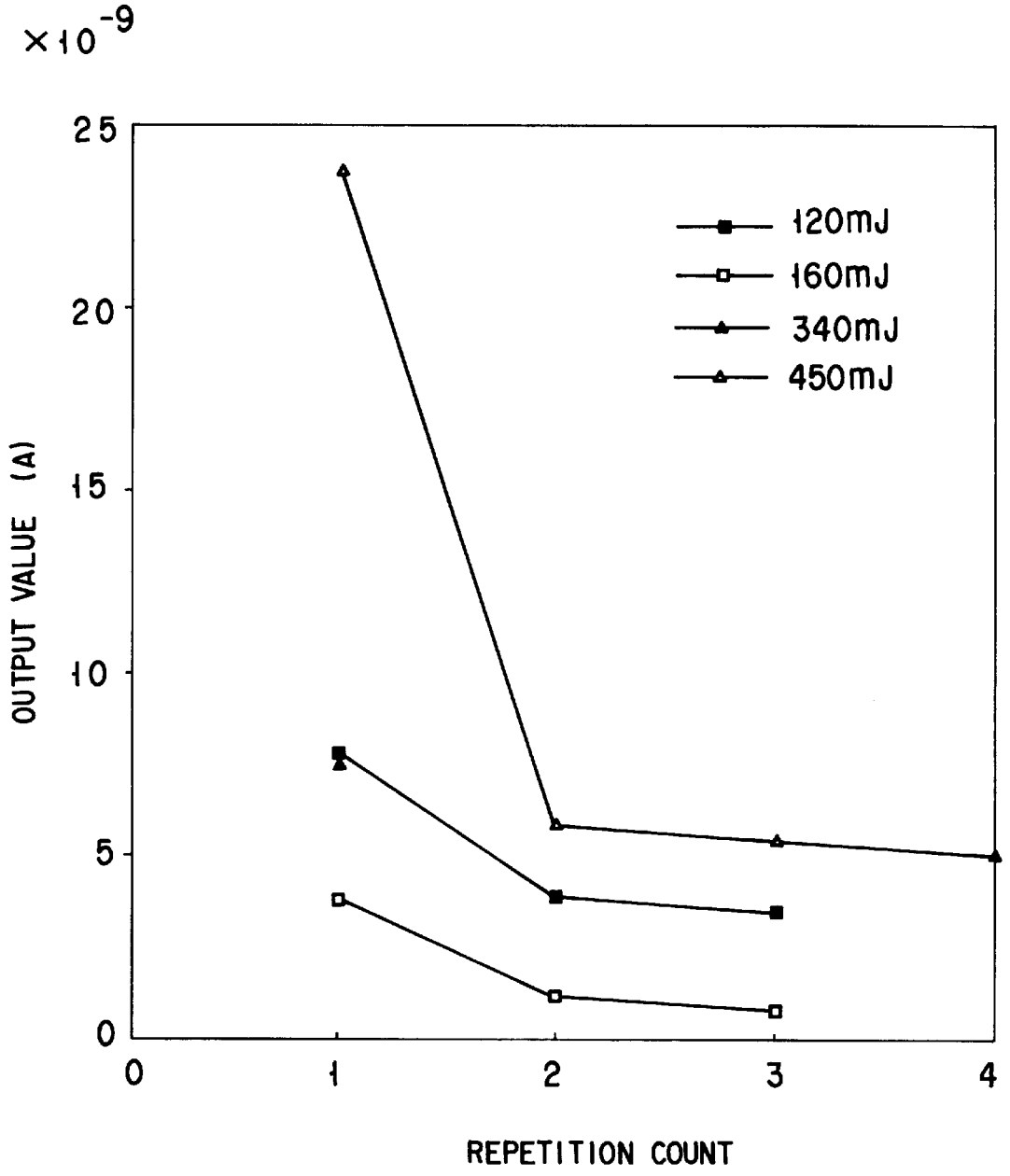
FIG. 12 is a graph showing a relationship between still another irradiation mode of a laser beam and an amount of discharged hydrogen.

A laser beam having a beam size of 0.9 cm×0.9 cm was repeatedly radiated on all the areas with an output energy being increased in an order of 120 mJ, 160 mJ, 340 mJ, and 450 mJ predetermined times without distinguishing the areas from each other. At this time, energy densities per pulse of the laser beam having the output energies on the film surface were about 104 mJ/cm$^2$, 138 mJ/cm$^2$, 294 mJ/cm$^2$, and 389 mJ/cm$^2$, respectively. The result is shown in FIG. 12. In this experiment, when a laser beam having an output energy of 340 mJ (energy density: 294 mJ/cm$^2$) or less was radiated on the film, any damage was not detected in the film. However, when a laser beam having an output energy of 450 mJ (energy density: 389 mJ/cm$^2$) was radiated on the film, damage to the film was detected.

[Experiment 6]

Figure 13:
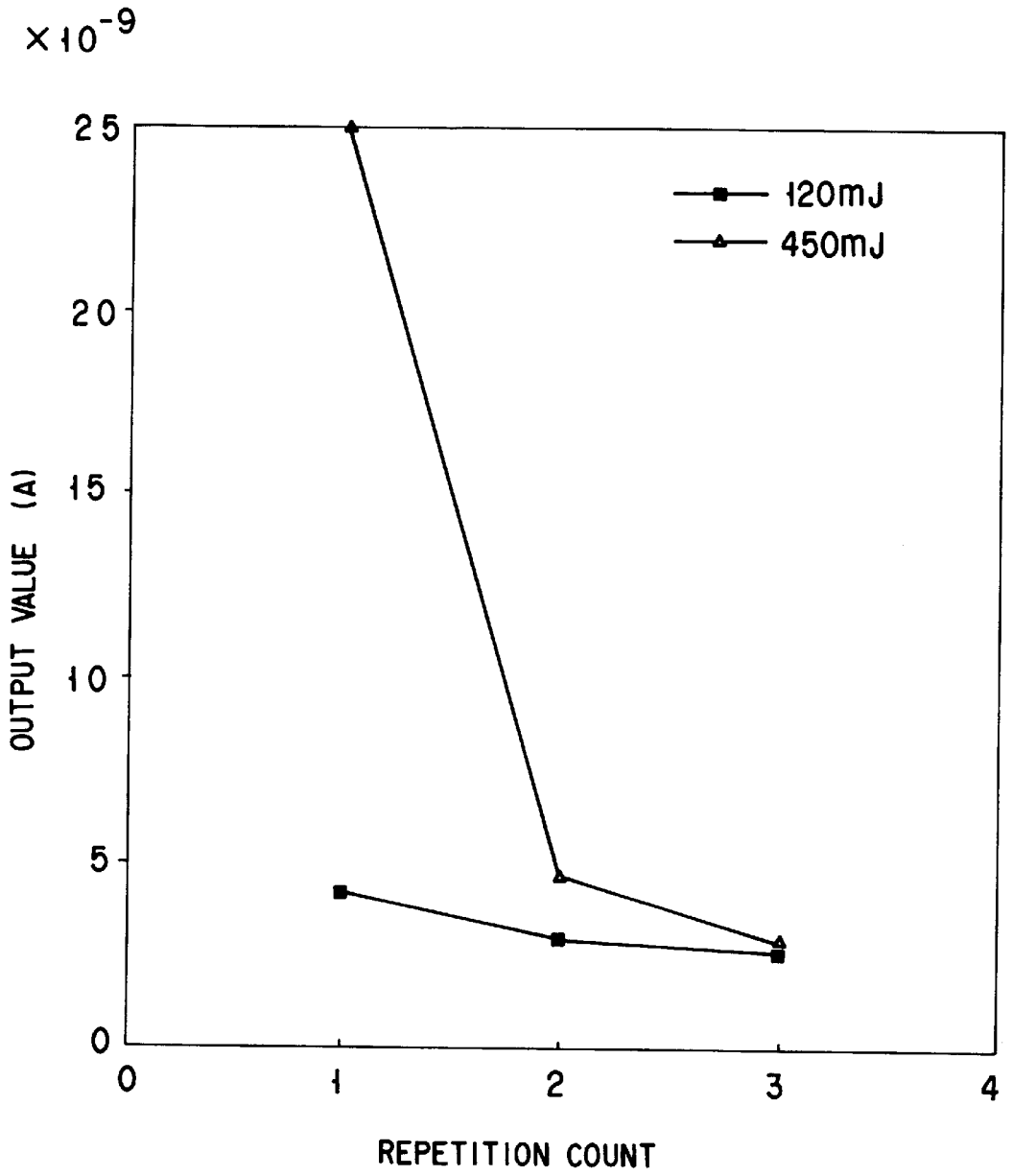
FIG. 13 is a graph showing a relationship between still another irradiation mode of a laser beam and an amount of discharged hydrogen.

A laser beam a beam size of 0.9 cm×0.9 cm was repeatedly radiated on all the areas with an output energy being gradually increased in an order of 120 mJ and 450 mJ predetermined times without distinguishing the areas from each other. At this time, energy densities per pulse of the laser beam having the output energies on the film surface were about 104 mJ/cm$^2$ and 389 mJ/cm$^2$, respectively. The result is shown in FIG. 13. In this experiment, when the laser beam having the output energy of 450 mJ (energy density: 389 mJ/cm$^2$) was radiated on the film, damage to the film was detected.

[Experiment 7]

Figure 14:
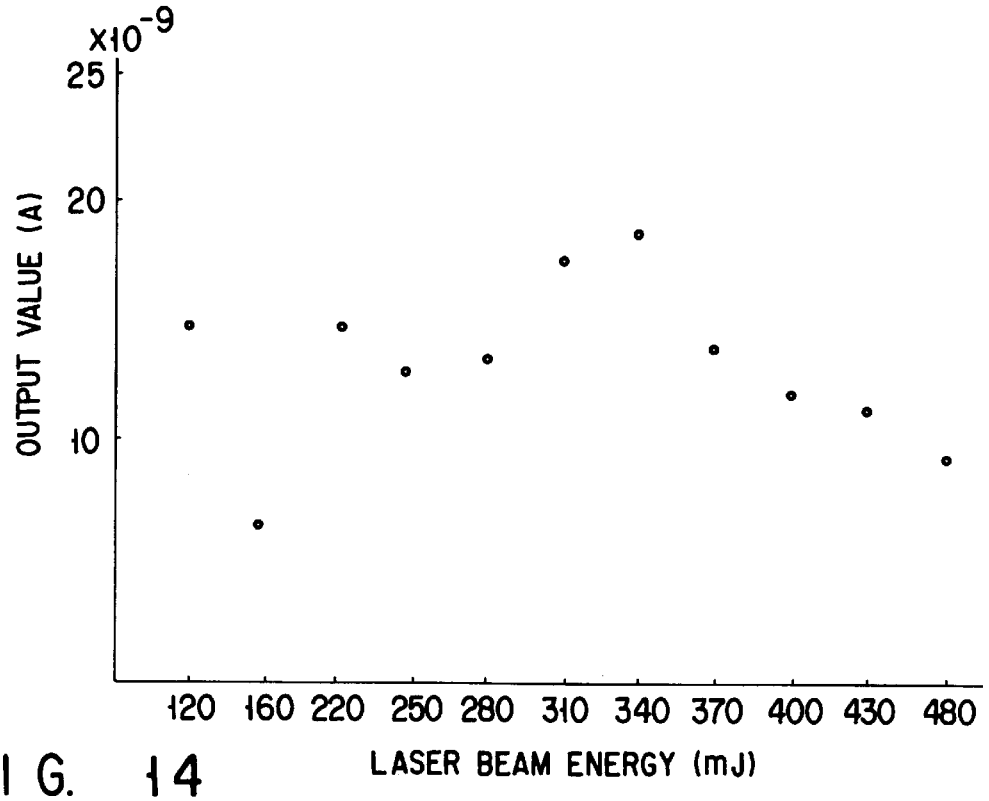
FIG. 14 is a graph showing a relationship between still another irradiation mode of a laser beam and an amount of discharged hydrogen.

A laser beam having a beam size of 0.65 cm×0.65 cm was radiated on all the areas once with an output energy being gradually increased from 120 mJ to 480 mJ, as shown in FIG. 14, without distinguishing the areas from each other. The result is shown in FIG. 14. In this experiment, any damage was not detected in the a-Si:H film. The a-Si:H film was poly-crystallized by radiating the laser beam having the output energy of 480 mJ on the a-Si:H film. This was confirmed by an X-ray analyzer.

When the output energies of 120 mJ and 480 mJ were used, energy densities per pulse of the laser beam on the film surface were about 199 mJ/cm$^2$ and 795 mJ/cm$^2$, respectively. In addition, since the light absorbance of the a-Si:H film at a wavelength of 248 nm was 30%, the absorption energy densities of the a-Si:H film at the output energies of 120 mJ and 480 mJ were 60 mJ/cm$^2$ and 239 mJ/cm$^2$, respectively.

[Experiment 8]

Figure 15:
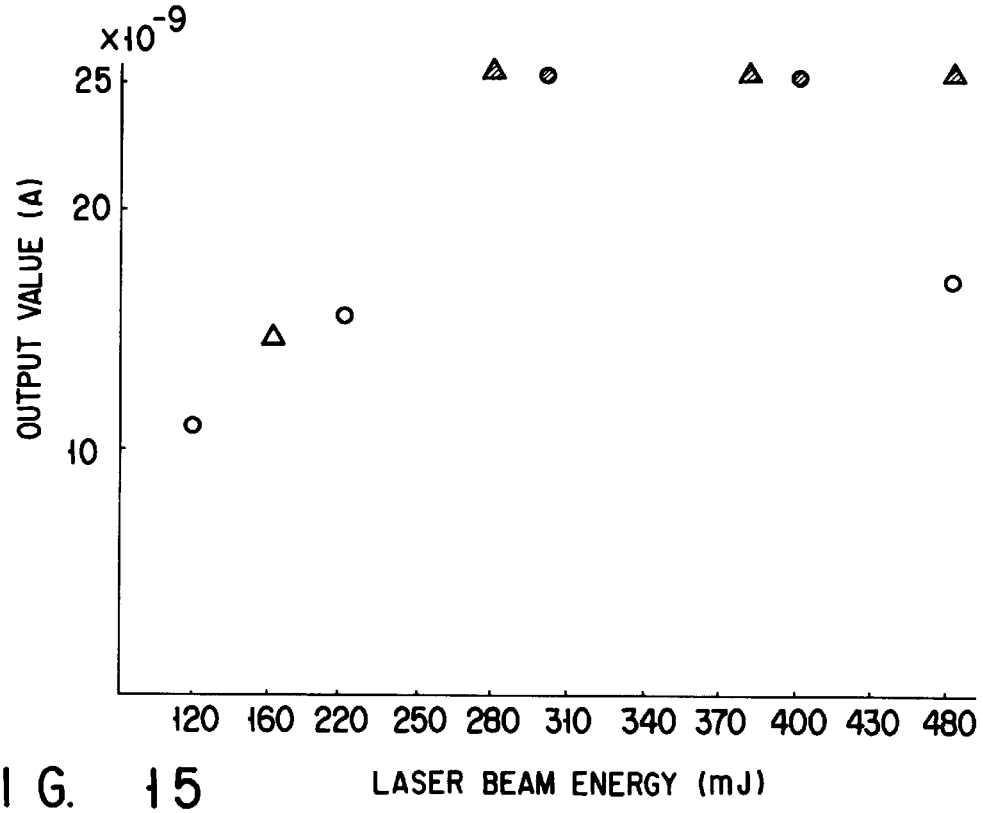
FIG. 15 is a graph showing a relationship between still another irradiation mode of a laser beam and an amount of discharged hydrogen.

An a-Si:H film was divided into two areas. A laser beam having a beam size of 0.65 cm×0.65 cm was radiated on one area with an output energy being gradually increased in an order of 120 mJ, 220 mJ, 300 mJ, 400 mJ, and 480 mJ once. A laser beam having a beam size of 0.65 cm×0.65 cm was radiated on the other area with an output energy being gradually increased in an order of 160 mJ, 280 mJ, 380 mJ, and 480 mJ once. The result is shown in FIG. 15. In this experiment, damage to all the films was detected. At each hatched point in FIG. 15, an output value of hydrogen exceeded 25.

[Experiment 9]

Under the same conditions as those in Experiment the temperature of the substrate 5 was set to be 25° C. and 300° C. through the susceptor 18 to poly-crystallize the a-Si:H film. When the temperature of the substrate 5 was 25° C., an average crystal grain size was about 100 nm. When the temperature of the substrate 5 was 300° C., an average crystal grain size was six times of the above average crystal grain size, i.e., about 600 nm.

According to the above results, when a laser beam having a high energy is radiated on the a-Si:H film from the beginning, hydrogen in the a-Si:H film is discharged at once to damage the film. Although a laser beam having a low energy is radiated on the a-Si:H film from the beginning, when a laser beam having a high energy is then radiated on the a-Si:H film at once, the film is damaged as described above. However, the following fact will be understood. That is, a laser beam having a low energy is radiated on the a-Si:H film from the beginning, and the energy is gradually increased, thereby preventing the film from being damaged. This leads to the following analysis result surmised by the following reason. When the irradiation energy of a laser beam is gradually increased, hydrogen in the film is gradually discharged, and a shock caused by the discharge is small, such that the film is not damaged. Although a method of forming a polysilicon film while an amount of hydrogen is monitored had been described in the above embodiment, when required data are obtained in advance, the polysilicon film can be formed without monitoring the amount of hydrogen. For example, when a relationship between a laser beam intensity, an irradiation count, and an amount of discharged hydrogen for each of substrates having the same thin film and the same size is obtained in advance, the relationship can be used as data in place of data obtained by monitoring an amount of discharged hydrogen.

A method of laser-annealing the amorphous area of an object to be processed and evaluating the crystallized state of the area by using the apparatus shown in FIGS. 3 and 5 will be described below. In this case, as in the above embodiment, a polysilicon film is formed on the surface of a glass substrate using a hydrogenated amorphous silicon (a-Si:H) film manufactured by plasma CVD. However, when the problem of the heat resistance of the substrate 5 is solved, a polysilicon film can be formed by using an amorphous silicon film manufactured by LPCVD. Laser annealing in which a polysilicon film is formed while the crystallized state is evaluated can be applied to a case of using the above LPCVD silicon film and a case of using a semiconductor film consisting of a material other than silicon.

Figure 16:
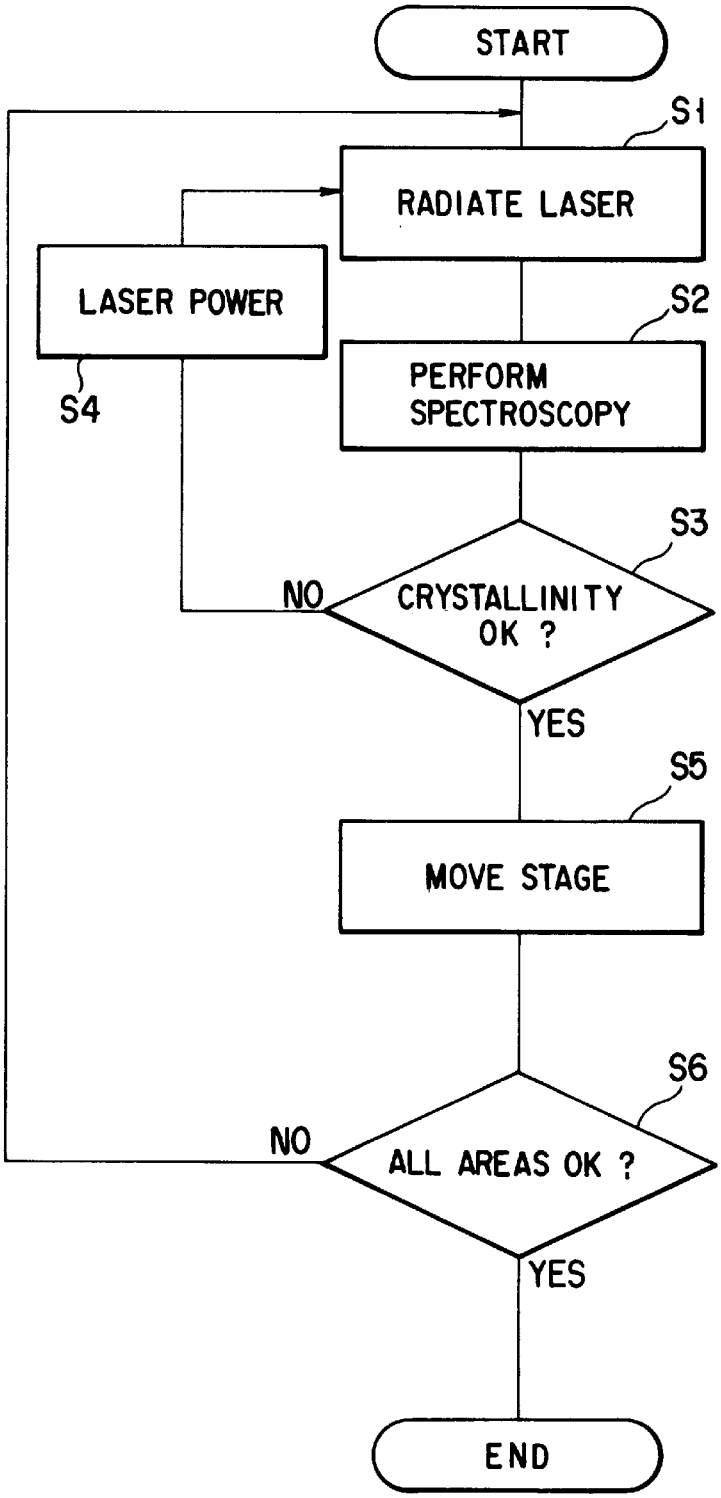
FIG. 16 is a flow chart showing a method of forming a polysilicon film with a crystallized state evaluated.

The method of this embodiment will be described below with reference to a flow chart shown in FIG. 16.

In step S1, the laser power source 21 is turned on according to a command from the CPU 20 in which a control program on the basis of the present invention is incorporated. A laser beam is transmitted from the excimer laser source 22 to the reflecting member 10 through the homogenizer 23. The laser beam is directed toward a desired area on a surface to be processed of the substrate 5. When the moving mechanism 11 is appropriately driven, the laser is radiated to scan the amorphous silicon film in the desired area.

In step S2, the substrate 5 is irradiated with a beam from the light source 17 (FIG. 5) having a light intensity which is uniform within the range of 200 nm to 500 nm. A reflected beam from the desired amorphous silicon area is focused on the spectroscope 16 by the optical system (not shown) to be spectroscopically detected.

In step S3, a band gap spectroscopic reflectance distribution obtained by the reflected beam in the above area is compared with a prestored band gap spectroscopic reflectance distribution concerning a reference semiconductor crystal material. As will be described later, is known that a sample having a desired semiconductor crystal state represents a spectroscopic reflectance distribution which is almost fixed. Therefore, a reference spectroscopic reflectance distribution is compared with the detected spectroscopic reflectance distribution of the observed portion. By using a degree of approximation of the distributions, the crystallized state of the observed portion, i.e., the progress of the laser annealing can be determined.

As the result of the comparison, when it is determined that the crystallized state of the observed portion does not reach a reference level, the CPU 20 transmits a command signal for increasing a laser irradiation energy to the system, and the laser irradiation energy is adjusted in step S4. Note that it is preferable that the laser irradiation energy is gradually increased in a normal state because of the following reasons. That is, as described above, when an excessive laser irradiation energy is applied to the film at once, hydrogen in an amorphous silicon film containing an excessive amount of hydrogen and manufactured by plasma CVD is sprayed at once, so that the silicon film may be damaged.

As a method of adjusting a laser irradiation energy, a method of changing an output from the excimer laser source 22, a method of changing a laser irradiation interval in spot irradiation, or a method of adjusting the moving speed of the moving mechanism 11 for driving the reflecting member 10 on the X-Y plane is known. When each of these methods is independently used, or these methods are combined and used, the laser irradiation energy can be adjusted to a desired value.

A sequence of laser irradiation (S1), spectroscopic detection (S2), and crystallized state evaluation (S3) is continuously repeated in accordance with a command from step S4 until the crystallized state of the observed portion, i.e., a portion to be processed reaches a reference level. When it is determined in step S3 that the crystallized state of the portion to be processed reaches the reference level, the flow advances to step S5. The moving mechanism 11 is driven, and the laser beam is radiated to scan the next irradiation area. In this manner, the sequence from steps S1 to S5 is repeated until it is determined in step S6 that laser annealing to all the areas to be processed is finished.

As described above, according to a method of forming a polysilicon thin film using a method of evaluating a semiconductor crystal state according to the present invention, a crystallized state is determined by a spectroscopic reflectance distribution typically conspicuously representing the characteristics crystallized state of the semiconductor without using an expensive apparatus such as a Raman spectroscope, for a special purpose. On the basis of this determination, a laser irradiation energy can be feedback-controlled in real time. For this reason, laser annealing can easily be performed at a low cost. In addition, TFT liquid crystal displays can be manufactured at a high yield and throughput.

Figure 17:
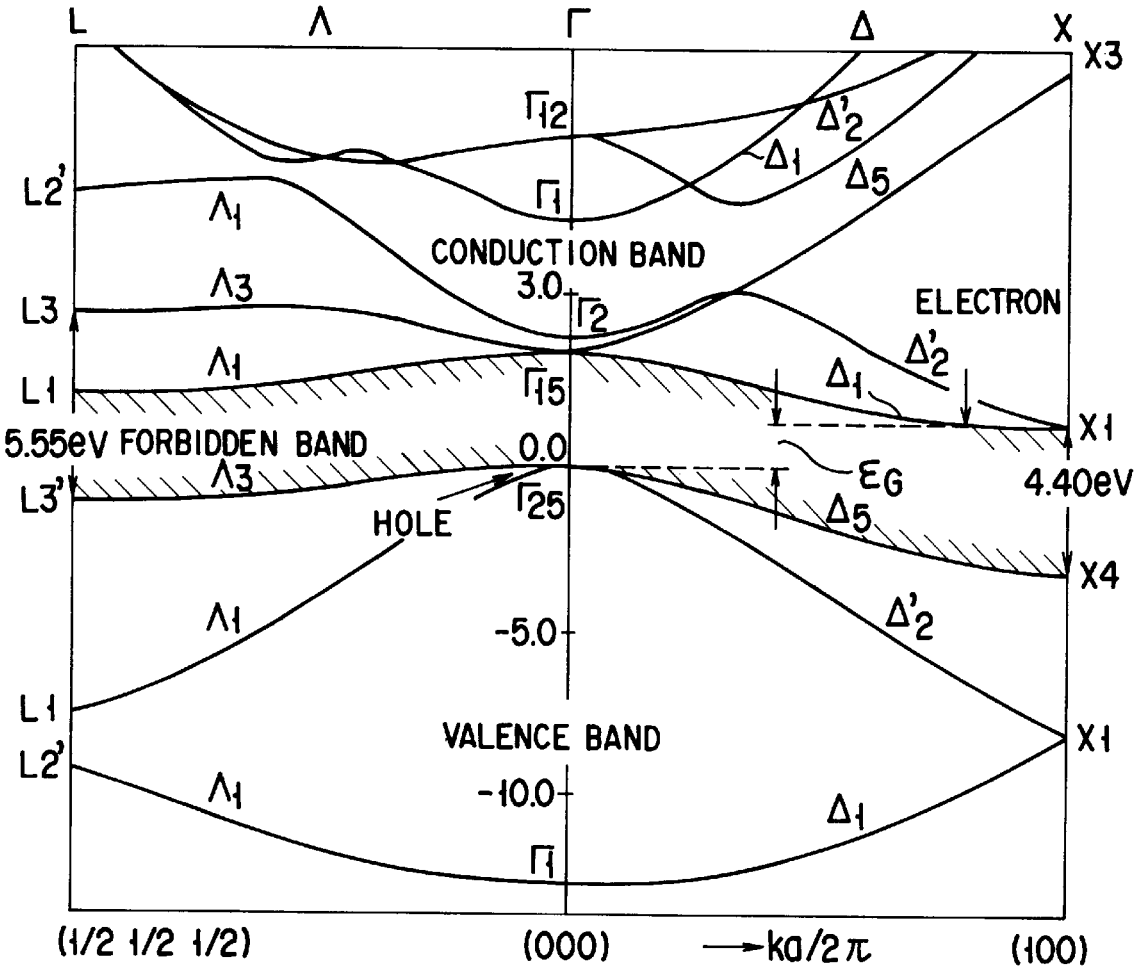
FIG. 17 is a view showing an energy-band structure of a silicon crystal.

A laser reflectance distribution of a semiconductor band gap which serves as a reference used for performing the method according to the present invention will be described below. The energy band of a silicon crystal, as is known well, has the structure shown in FIG. 17. This band gad is about 3.43 eV at the Γ point and is about 4.40 eV at the X point. A laser beam having a beam size of, e.g., 0.65 (cm)×0.65 (cm)=0.43 ($cm^2$) and an laser energy of, e.g., 400 mJ is radiated on a reference semiconductor crystal through a transparent window having an optical transmittance of 75% under the condition that the reference semiconductor crystal has the above band gap structure and a film thickness of 500 Å.

Figure 18:
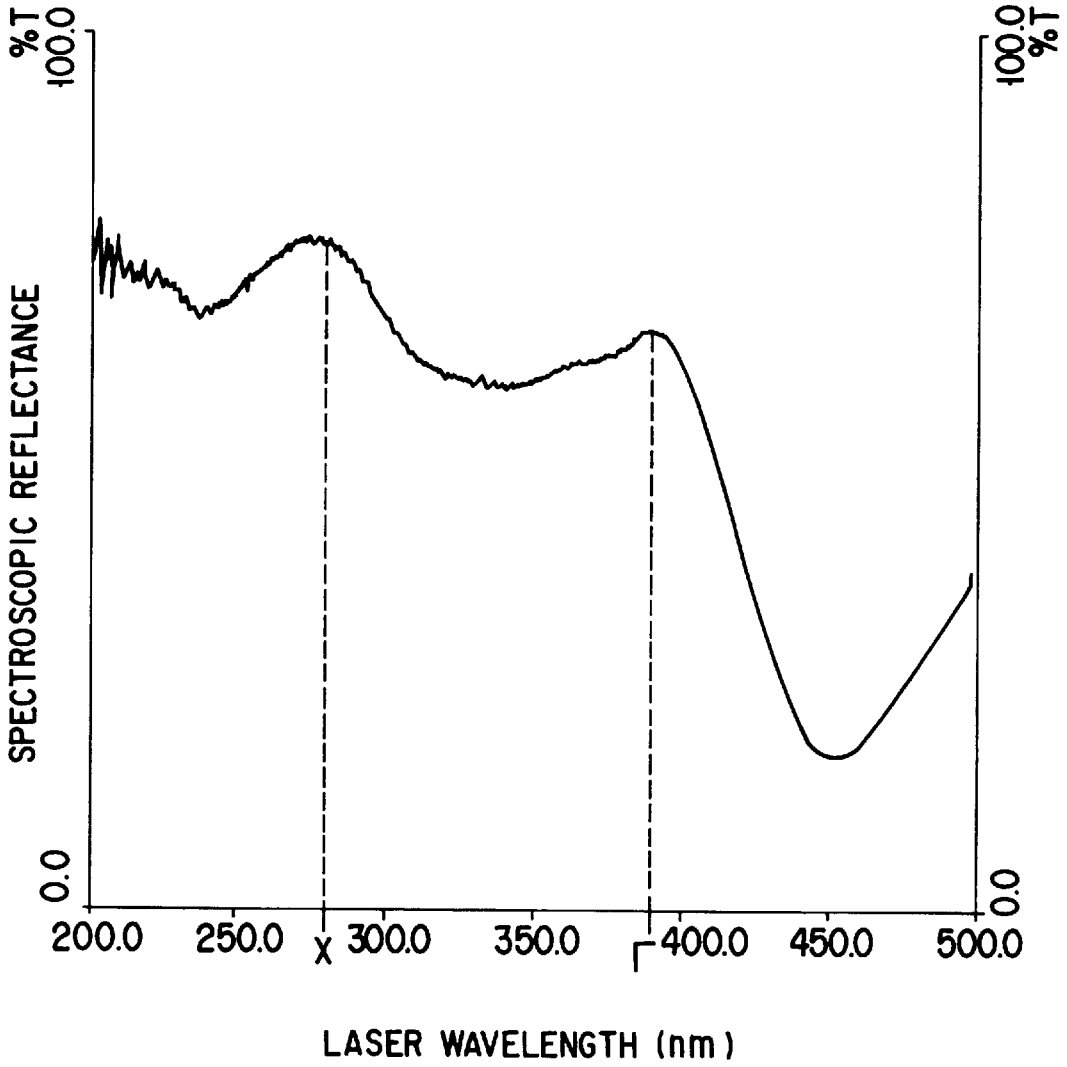
FIG. 18 is a graph showing the band gap spectral reflectance of a polysilicon film in an ideal state.

A band gap spectroscopic reflectance distribution obtained when a laser having the above conditions is radiated on the reference semiconductor crystal is shown in FIG. 18. As shown in FIG. 18, the band gap spectroscopic reflectance distribution has two peak values near 284 nm and 364 nm. These peak values correspond to the X and Γ points of particular points in the first Brillouin zone of the silicon crystal, respectively.

Figure 19:
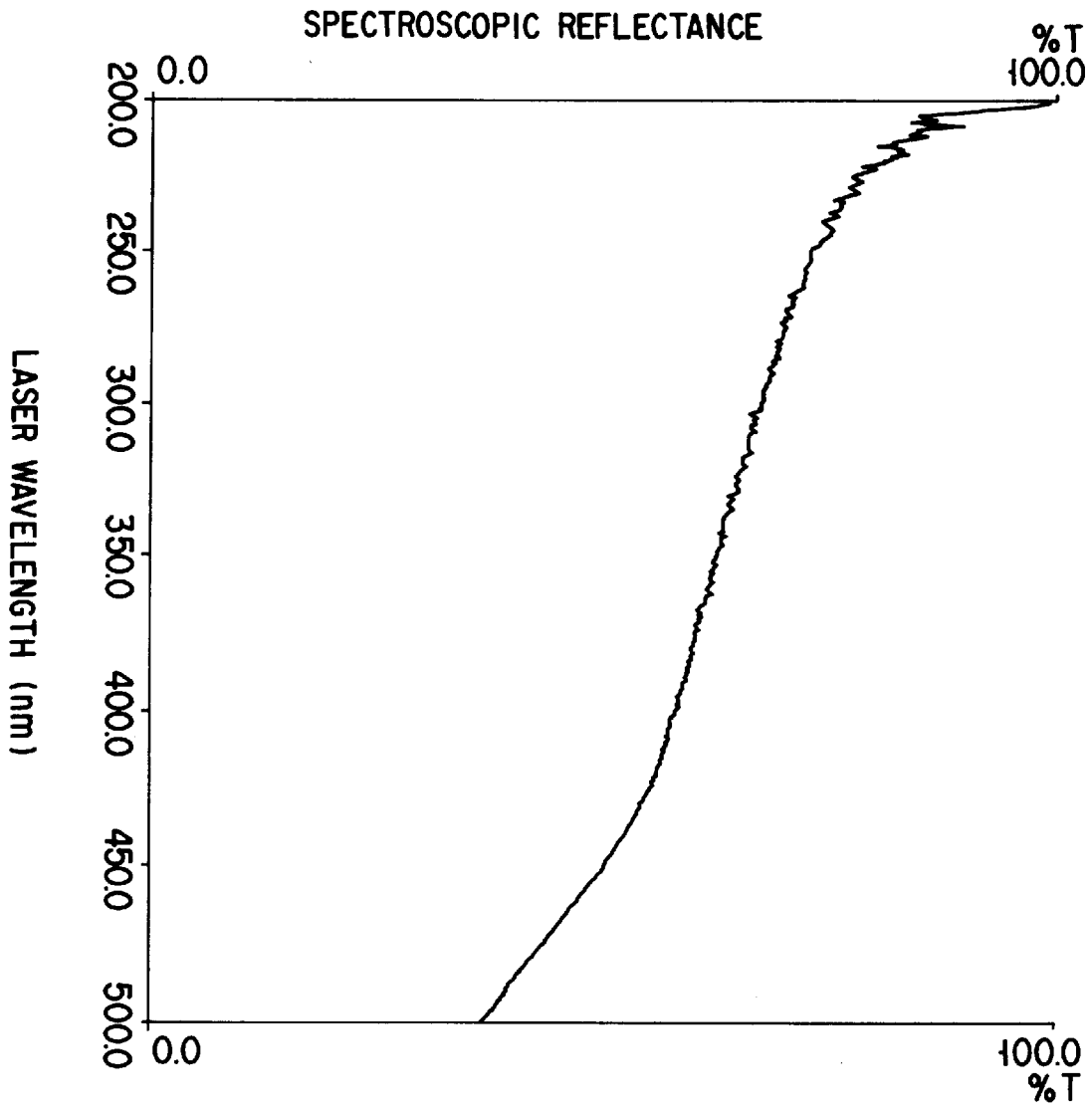
FIG. 19 is a graph showing the band gap spectral reflectance of an amorphous silicon film.

The band gap spectroscopic reflectance distribution of amorphous silicon is shown in FIG. 19 as a further reference. It is known that, as shown in FIG. 19, the band gap spectroscopic reflectance distribution of the amorphous silicon has a distribution having no peak and representing a characteristic curve inclined downward the right.

As described above, as is easily understood in comparing FIG. 18 with FIG. 19, the outline shape of the band gap spectroscopic reflectance distribution of the reference semiconductor crystal is a unique shape. The first information concerning the band gap spectroscopic reflectance distribution is stored as reference information in advance, and the first information is compared with the second information concerning a band gap spectroscopic reflectance distribution obtained in real time during annealing of an object to be processed, so that the crystallized state of the object can be known in real time.

Figure 20:
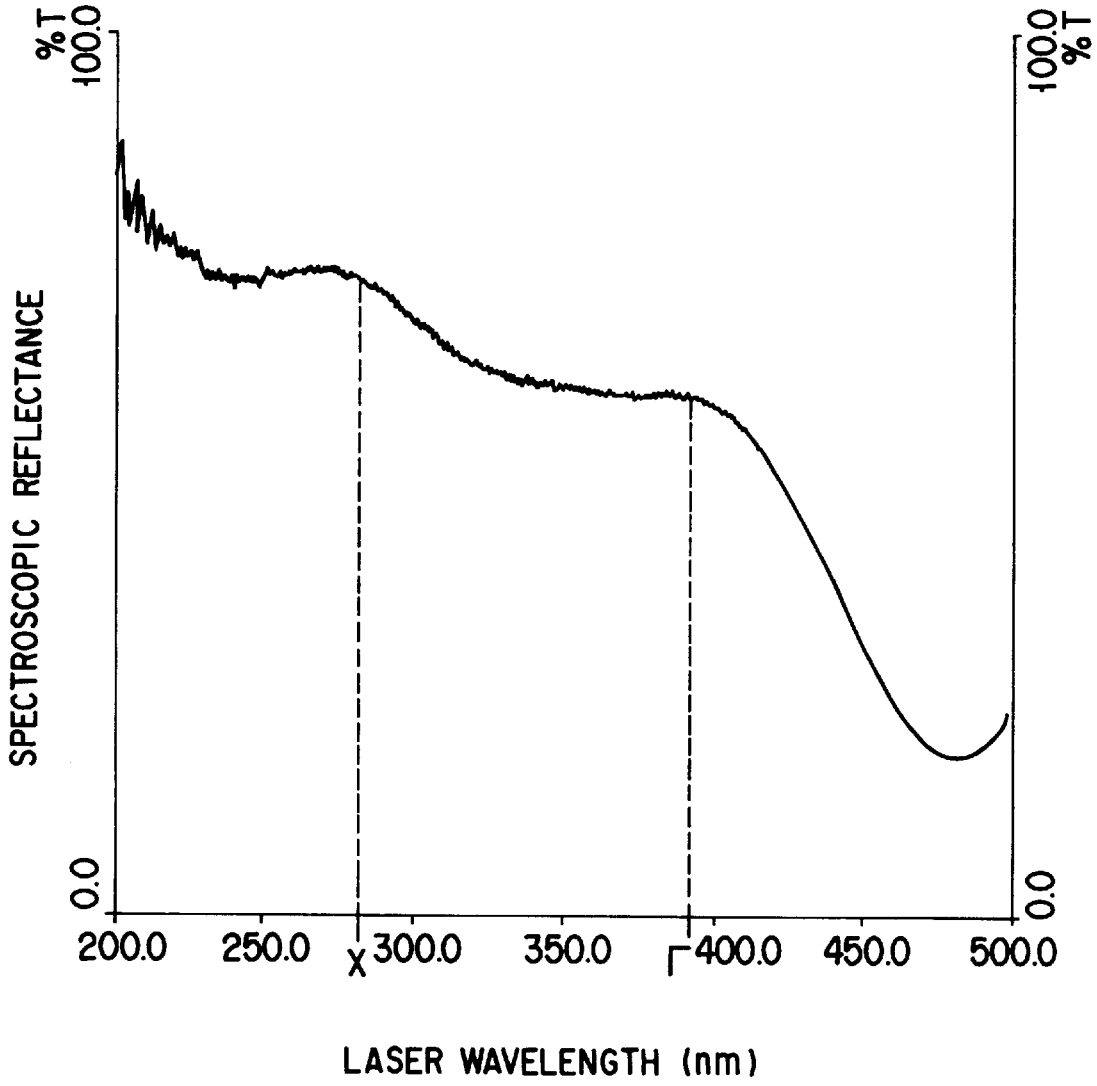
FIG. 20 is a graph showing the band gap spectral reflectance of a film in which amorphous silicon is insufficiently transformed into polysilicon due to an insufficient energy of a laser beam.
Figure 21:
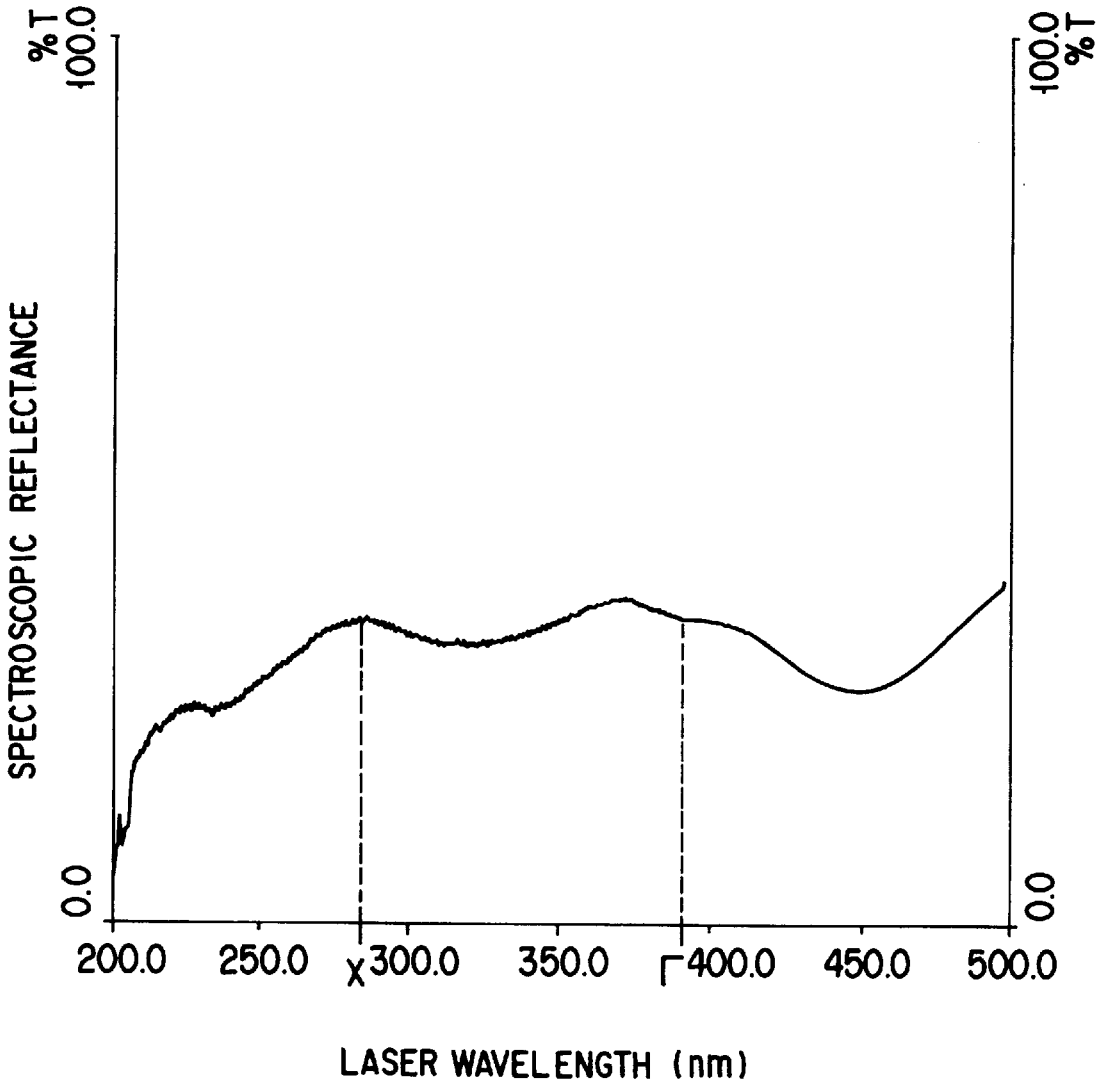
FIG. 21 is a graph showing the band gap spectral reflectance of a film damaged by an excessive energy of a laser beam.

For example, when a laser irradiation energy transmitted by the laser source 22 is not enough to crystallize the object, e.g., 200 mJ, the band gap spectroscopic reflectance distribution detected from a reflected beam from the object, as shown in FIG. 20, has a curve inclined downward to the right. In contrast to this, when a laser irradiation energy transmitted from the laser source 22 has a value excessively large to crystallize a semiconductor, e.g., 600 mJ, the band gap spectroscopic reflectance distribution detected from the reflected beam from the object, as shown in FIG. 21, has a characteristics curve representing that the spectroscopic reflectance distribution has an outline shifted downward due to damage to the entire film. It is understood that this phenomenon is obtained by forming a silicon oxide film on the surface of the object.

When the band gap spectroscopic reflectance distribution shown in FIG. 20 is spectroscopically detected, the system can be feedback-operated in real time so that the laser irradiation energy is gradually increased to cause the spectroscopic reflectance distribution in FIG. 20 to be close to the spectroscopic reflectance distribution in FIG. 18. In this manner, the laser irradiation energy is preferably controlled before the film damage shown in FIG. 21. In addition, if the band gap spectroscopic reflectance distribution shown in FIG. 21 is spectroscopically detected, the sample can be picked as a defective one.

As described above, a laser irradiation energy is gradually increased such that the distribution in FIG. 20 is close to the distribution in FIG. 18. As described above, when an excessive laser irradiation energy is applied from the beginning, hydrogen contained in an amorphous silicon is sprayed at once, and the silicon film may be damaged, thereby detecting the sample as a defective one.

Since the reference reflectance distribution does not completely coincide with the reflectance distribution of an object to be processed due to the characteristics of the method of analyzing these distributions, this comparison is performed by a method of finding a degree of approximation between these distributions while allowing errors to some extent. For example, when the peak values at the X point (about 284 nm) and the Γ point (about 364 nm) are compared with each other, an error of ±20 nm can be allowed. In addition, the outline shapes of the spectroscopic reflection distributions are traced and processed, and the obtained data are compared with each other with a certain allowance range, so that the crystallized state of the object to be processed can be evaluated.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming *a* polycrystalline silicon film for the manufacture of a liquid crystal display (LCD) having a pixel portion and a driver unit, comprising:

(a) forming a hydrogenated amorphous silicon film ([α] *a*-Si:H film) on a surface of a glass substrate in areas of said substrate corresponding to said pixel portion and said driver unit, (b) determining a minimum energy density of a laser beam which, when irradiated on the surface of said [α] *a*-Si:H film causes hydrogen therein to explosively discharge from said [α] *a*-Si:H film, which energy density value is termed a ceiling value, (c) repeatedly irradiating said [α] *a*-Si:H film corresponding to said driver unit with a laser beam having an energy density value below said ceiling value, measuring the amount of hydrogen released after each said irradiation, and increasing the energy density of said repeated laser beam irradiations whenever consecutive irradiations give a measured amount of hydrogen released which decreases after said consecutive irradiations, and (d) crystallizing said repeatedly irradiated [α] *a*-Si:H film corresponding to said driver unit by irradiation with a laser beam having an energy density above said ceiling value and sufficient to cause silicon in said repeatedly irradiated [α] *a*-Si:H film to crystallize into [a] *the* polycrystalline silicon film.

2. A method according to claim 1, wherein all laser beams are emitted from a single light source.

3. A method according to claim 1, wherein said glass substrate is heated to about 300° C. during the crystallizing step.

4. A method according to claim 1, wherein all laser beams are constituted by a beam having a square section smaller than said repeatedly irradiated film and operated to scan said repeatedly irradiated film.

5. A method according to claim 4, wherein said all laser beams pass through a homogenizer comprising an expand lens and a biprism lens while the laser beam is radiated from said light source on said repeatedly irradiated film.

6. A method according to claim 5, wherein the laser beams are emitted as a pulse.

7. A method according to claim 6, wherein an energy of at least one of said laser beams is adjusted by adjusting an output of a laser source.

8. A method according to claim 6, wherein an energy of at least one of said laser beams per unit area is adjusted by changing an interval of the pulse.

9. A method according to claim 6, wherein an energy of at least one of the laser beams is adjusted by changing a scanning speed of the beam.

10. A method according to claim 6, wherein the ceiling value is set such that an energy density on a surface of said repeatedly irradiated film is set to be lower than 173 mJ/cm$^2$.

11. A method according to claim 6, wherein the energy density of said laser beam for crystallizing said film is set such that an energy density on a surface of said repeatedly irradiated film is set to be not less than 795 mJ/cm$^2$.

12. A method according to claim 4, wherein the crystallizing further comprises [the] steps of[:

] radiating a test light on said repeatedly irradiated film;

spectroscopically detecting a reflected light of the test light from said repeatedly irradiated film to obtain detection data concerning a band gap spectroscopic reflectance distribution of said repeatedly irradiated film and comparing reference data concerning a band gap spectroscopic reflectance distribution of a polysilicon film and responding to the detection data with the detection data to evaluate a crystallized state of said repeatedly irradiated film *to determine whether said irradiated film changes to a crystallized state polysilicon film; and*

*stopping the irradiation of the laser beam onto the film, if the amorphous silicon film changes to the crystallized state polysilicon film, and continuing the irradiation of the film if the amorphous silicon film does not change to the crystallized polysilicon film.*

13. A method according to claim 12, wherein the detection *data* and the reference data are peak values of the band gap spectroscopic reflectance distribution.

14. A method according to claim 12, wherein the detection *data* and the reference data are profiles of the band gap spectroscopic reflectance distribution.

15. A method according to claim 12, further comprising the step of adjusting an energy of said crystallizing laser beam on the basis of evaluation of the crystallized state.

*16. A method for forming a polycrystalline silicon film according to claim 1 further comprising determining crystallinity of the repeatedly irradiated amorphous silicon film by steps of:*

*heating the repeatedly irradiated amorphous silicon film so that said amorphous silicon film changes to the polycrystalline silicon film;*

*radiating a test light onto the film during or after the heating of said repeatedly irradiated amorphous silicon film;*

*spectroscopically detecting a reflected light of the test light from said heated silicon film to obtain detection data concerning band gap spectroscopic reflectance distribution of said heated silicon film; and comparing reference data concerning band gap spectroscopic reflectance distribution of a polycrystalline sample silicon film, having a reference level of crystallinity, with the detection data to evaluate a crystallized state of the heated silicon film to detect whether the crystallized state of the silicon film reaches the reference level; and*

*stopping the heating of the heated silicon film, if the crystallized state of the heated silicon film reaches the reference level, and*

*continuing the heating of the heated silicon film, if the crystallized state of the film does not reach the reference level.*

*17. A method according to claim 16, wherein the detection data and the reference data are peak values of the band gap spectroscopic reflectance distribution.*

*18. A method according to claim 16, wherein the detection data and the reference data are profiles of the band gap spectroscopic reflectance distribution.*

*19. A method for forming a polycrystalline silicon film according to claim 1 further comprising determining crystallinity of the repeatedly irradiated amorphous silicon film by steps of:*

*heating the repeatedly irradiated amorphous silicon film so that said amorphous silicon film changes to the polycrystalline silicon film;*

*radiating a test light onto the silicon film during the heating of the repeatedly irradiated amorphous silicon film,*

*spectroscopically detecting a reflected light of the test light from said heated silicon film to obtain detection data concerning band gap spectroscopic reflectance distribution of said heated silicon film,*

*comparing reference data concerning band gap spectroscopic reflectance distribution of a polycrystalline silicon sample film, having a reference level of crystallinity, with the detection data to evaluate the crystallized state of the heated silicon film to detect whether the crystallized state of the heated silicon film reaches the reference level,*

*stopping the heating of the film, if the crystallized state of the heated silicon film reaches the reference level, and*

*continuing the heating of the heated silicon film, if the crystallized state of the film does not reach the reference level.*

*20. A method according to claim 19, wherein said heating includes a step of irradiating a laser beam onto the repeatedly irradiated amorphous silicon film, while adjusting an energy of said laser beam according to the crystallized state as evaluated in the comparing step.*

*21. A method according to claim 20, wherein the energy of said laser beam is gradually increased until the crystallized state of the repeatedly irradiated amorphous silicon film reaches said reference level.*

* * * * *